United States Patent
Zeng

(10) Patent No.: US 10,104,797 B2
(45) Date of Patent: Oct. 16, 2018

(54) POWER MODULE, POWER CONVERTER AND MANUFACTURING METHOD OF POWER MODULE

(71) Applicant: Delta Electronics (Shanghai) Co., Ltd., Shanghai (CN)

(72) Inventor: Jian-Hong Zeng, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 170 days.

(21) Appl. No.: 14/568,078

(22) Filed: Dec. 11, 2014

(65) Prior Publication Data
US 2015/0173248 A1 Jun. 18, 2015

(30) Foreign Application Priority Data
Dec. 16, 2013 (CN) .......................... 2013 1 0694495

(51) Int. Cl.
*H05K 7/14* (2006.01)

(52) U.S. Cl.
CPC .. *H05K 7/1432* (2013.01); *H01L 2224/05553* (2013.01); *H01L 2224/0603* (2013.01); *H01L 2224/32145* (2013.01); *H01L 2224/32245* (2013.01); *H01L 2224/48091* (2013.01); *H01L 2224/48137* (2013.01); *H01L 2224/48247* (2013.01); *H01L 2224/48257* (2013.01); *H01L 2224/73265* (2013.01); *H01L 2924/13055* (2013.01); *H01L 2924/181* (2013.01); *H01L 2924/19105* (2013.01); *Y10T 29/4913* (2015.01)

(58) Field of Classification Search
None
See application file for complete search history.

(56) References Cited

U.S. PATENT DOCUMENTS

| | | | |
|---|---|---|---|
| 6,313,598 B1 | 11/2001 | Tamba et al. | |
| 6,777,800 B2 * | 8/2004 | Madrid | H01L 23/49524 257/666 |
| 6,841,852 B2 * | 1/2005 | Luo | H01L 23/49575 257/666 |
| 8,138,529 B2 * | 3/2012 | Wu | H01L 23/057 257/268 |
| 8,455,931 B2 * | 6/2013 | Wu | H01L 23/057 257/268 |
| 8,582,317 B2 * | 11/2013 | Wen | H01L 23/49562 361/764 |

(Continued)

FOREIGN PATENT DOCUMENTS

| | | |
|---|---|---|
| CN | 1866513 A | 11/2006 |
| CN | 102339818 A | 2/2012 |

(Continued)

*Primary Examiner* — Hoang-Quan Ho
(74) *Attorney, Agent, or Firm* — CKC & Partners Co., Ltd.

(57) ABSTRACT

A power module includes a heat-dissipating substrate, a first planar power device and a second planar power device. The first planar power device includes a plurality of electrodes disposed on an upper surface of the first planar power device. The second planar power device includes a plurality of electrodes disposed on an upper surface of the second planar power device. Lower surfaces of the first planar power device and the second planar power device are disposed on the heat-dissipating substrate.

23 Claims, 27 Drawing Sheets

(56) References Cited

U.S. PATENT DOCUMENTS

| | | | |
|---|---|---|---|
| 8,587,116 B2 * | 11/2013 | Hohlfeld | H01L 23/3735 257/675 |
| 9,107,290 B1 * | 8/2015 | Chen | H01L 23/49811 |
| 9,129,838 B2 * | 9/2015 | Taniguchi | H01L 29/2003 |
| 2002/0109184 A1 * | 8/2002 | Hower | H01L 29/0878 257/335 |
| 2004/0004272 A1 * | 1/2004 | Luo | H01L 23/49575 257/666 |
| 2004/0016961 A1 * | 1/2004 | Shin | H01L 21/823487 257/329 |
| 2004/0180470 A1 | 9/2004 | Romano et al. | |
| 2006/0113664 A1 | 6/2006 | Shiraishi et al. | |
| 2007/0278516 A1 * | 12/2007 | Hashimoto | G06F 1/26 257/177 |
| 2008/0296782 A1 | 12/2008 | Otremba et al. | |
| 2010/0127383 A1 * | 5/2010 | Oka | H01L 24/40 257/692 |
| 2010/0133674 A1 * | 6/2010 | Hebert | H01L 23/49524 257/686 |
| 2010/0187605 A1 * | 7/2010 | Haeberlen | H01L 21/823475 257/337 |
| 2010/0327322 A1 * | 12/2010 | Kub | H01L 29/0847 257/194 |
| 2011/0049580 A1 * | 3/2011 | Lui | H01L 23/49575 257/262 |
| 2011/0101466 A1 * | 5/2011 | Wu | H01L 23/057 257/392 |
| 2011/0241170 A1 * | 10/2011 | Haeberlen | H01L 21/823475 257/532 |
| 2011/0278706 A1 * | 11/2011 | Herras | H01L 23/49537 257/675 |
| 2011/0292632 A1 * | 12/2011 | Wen | H01L 23/49562 361/820 |
| 2012/0080799 A1 * | 4/2012 | Hohlfeld | H01L 23/3735 257/772 |
| 2013/0222045 A1 * | 8/2013 | Wu | H01L 29/2003 327/419 |
| 2014/0306238 A1 * | 10/2014 | Taniguchi | H01L 23/49562 257/76 |
| 2015/0155217 A1 * | 6/2015 | Kim | H01L 23/49568 257/712 |
| 2015/0255380 A1 * | 9/2015 | Chen | H01L 23/49568 361/707 |
| 2015/0303164 A1 * | 10/2015 | Chen | H01L 24/32 361/720 |

FOREIGN PATENT DOCUMENTS

| | | |
|---|---|---|
| CN | 103050470 A | 4/2013 |
| TW | 201110351 A | 3/2011 |
| TW | 201324744 A | 6/2013 |
| TW | M468012 U | 12/2013 |

* cited by examiner

200b

200b

400b

400b

800b

800c

POWER MODULE, POWER CONVERTER AND MANUFACTURING METHOD OF POWER MODULE

RELATED APPLICATIONS

This application claims priority to China Application Serial Number 201310694495.8 filed Dec. 16, 2013, which is herein incorporated by reference.

BACKGROUND

Field of Invention

The present invention relates to a power module. More particularly, the present invention relates to a power module used in a POWER converter.

Description of Related Art

High efficiency and high power density has been the industry's requirements for power converters. High efficiency means less energy consumption, and energy saving helps to reduce carbon and protect environment. High power density stands for small size, lightweight and less space requirement, thereby reducing costs.

The energy consumption of the power converter is mainly composed of an on-state loss and a switch loss, especially the switch loss of an active device. The switch loss is more significantly affected by a working frequency. The power converter, especially the switch power converter, has the working frequency usually higher than 20 kHz in order to decrease audio noise. The selection of an actual working frequency of the power converter is more significantly affected by an inactive device, especially a magnetic element. If the magnetic element has a small size, a high frequency is usually needed to decrease the magnetic flux density of the magnetic element in order to achieve reliable work, thus inducing a high switch loss. Alternatively, the wire diameter of the wire set can be decreased and the number of loops in the magnetic element can be increased to increase the on-state loss.

On the contrary, if the magnetic element has a large size, the working frequency can be lowered under the precondition of assuring the reliable work, thus decreasing the switch loss. Also, the wire diameter of the wire set can be increased or the number of loops in the magnetic element may be decreased to decrease the on-state loss, thus decreasing the overall loss and obtaining high efficiency.

Therefore, one of the key factors of obtaining the high power density or the high efficiency is to enhance the space availability inside the power converter. As the space availability gets higher, the larger space is left for the inactive device, such as the magnetic element, a capacitor or the like, in which the inactive device is very important to the power converting efficiency. Thus, the large-size inactive element can be easily used to increase the power efficiency. Also, the total power of the power source can be increased by using the large-size inactive device, so that the power density of the power converter can be enhanced. Thus, for the high power space availability, the high efficiency can be achieved more easily under the specific power density, or the high power density can be achieved more easily under the specific efficiency, and it is possible to possess both the high power density and the high efficiency concurrently.

In addition, a semiconductor device is one of the important factors for determining the efficiency of the power converter. However, the use of the semiconductor device tends to unavoidably need to use additional materials, such as a packaging material for protecting the semiconductor device, a heat sink for heat dissipating, a fixture for fixing the semiconductor device, and the like. As the ratio of these materials inside the power converter gets greater, the internal space availability of the power converter gets worse. As a result, the ratio of the space, occupied by the power semiconductor device, to the total size of the power converter gets larger and larger, and gets more and more emphasized. In order to enhance the performance of the power converter, the space availability of the power converter has to be continuously enhanced. The package space availability of the semiconductor device becomes a bottleneck.

For an integrated power module (IPM), many semiconductor devices (e.g. a power device, a controlling device, a driving device) are integrated within a device package for the enhancement of the space availability within the device package. The power module has the advantages including use convenience and long average operation time without faults, etc., and is widely applied to various occasions. Because the power module has many power chips integrated together, a lot of heat is generated and distributed in many points of the power module. The thermal management thereof thus becomes very important. There are many existing arts for improving the heat dissipating ability of the IPM.

Referring to FIG. 1a, FIG. 1a is a schematic diagram showing a conventional power module 100a. As shown in FIG. 1a, the power module 100a includes a first power device 11, a second power device 12, a substrate 13, a bonding wire 14, a lead frame 15, and a molding material 16. The substrate 13 is a direct bonded copper (DBC) ceramic substrate, which is made from a copper layer 131 with good thermal conductivity and a ceramic substrate 132 with high insulation. A circuit pattern is formed on the DCB ceramic substrate, and then the respective power devices 11 and 12 are assembled with the DBC ceramic substrate. Then, with respect to parts of the electrodes on the first power device 11 and the second power device 12, the bonding wire 14 is adopted to accomplish the electrical connections between the front-side electrodes of the first/the second power devices 11, 12 and the DBC substrate and the lead frame 15. Thereafter, a molding material 16 is injected to enclose the areas desired to be protected, thus achieving dustproof, moisture-proof and insulation functions.

However, because all of the power devices have to be mounted on the DBC ceramic substrate, the DBC ceramic substrate with a larger area is required. However, the DBC ceramic substrate is relatively expensive, thus increasing the cost of the entire package module. In addition, the DBC ceramic substrate 132 is generally formed from aluminum oxide of which the coefficient of heat conductivity is equal to about 24 W/m·K, which is a great improvement with respect to the molding material (of which the coefficient of heat conductivity is generally lower than 1 W/m·K). However, the heat conducive property of aluminum oxide is still worse than that of metal (e.g., the coefficient of heat conductivity of copper is equal to about 400 W/m·K), so that the transversal heat diffusion ability of the DBC ceramic substrate is not good enough, and the poor thermal uniformity thereof tends to occur. Thus, in the conventional method, additional heat sink is added to expand the heat dissipating area and improving the thermal uniformity.

Referring to FIG. 1b, FIG. 1b is a schematic diagram showing another conventional power module 100b. Similar to the first power module 100a shown in FIG. 1a, the power device 100b includes the first power device 11, the second power device 12, and the substrate 13, in which the substrate 13 is a DBC ceramic substrate, and the first power device 11 and the second power device 12 are disposed on the substrate 13. Another side of the substrate 13 is disposed on the heat-dissipating unit 17 (e.g. a heat sink). The heat sink can be formed from good thermo-conductive materials, such as copper, aluminum, graphite or the like, so that the thermal uniformity performance of the power module 100b can be greatly increased.

Because the DBC ceramic substrate has high stress withstand capacity, a thicker molding material is required to ensure the overall insulation and stress withstand capacities. Because the heat dissipating ability of the DBC ceramic substrate is better, the DBC ceramic substrate is often designed for the application with a higher thermal density, and screws are adopted to fix the additional heat sinks. Because of high stress withstand packaging, the corresponding screws holes also need to be designed for stress withstanding, and thus occupies larger actual space. For example, a screw hole with a 3 mm hole diameter generally occupies an area of which the diameter is greater than 5 mm for meeting the stress withstanding requirements of the power module, thus lowering the space availability of the power module.

Furthermore, the power device 100b also includes a controlling/driving device 18. Because the controlling device and the driving device have a low energy consumption, and are relatively sensitive to temperature, they are usually disposed on the heat-dissipating unit 17 through a thermal insulating layer 19 (such as a printed circuit board (PCB), a molding material or the like). The thermal conductive insulating layer 19 can be formed by adhering, filling, or coating on the surface. Thereafter, the wire bonding is performed to accomplish the electrical connections among the first power device 11, the second power device 12, the controlling/driving device 18, the substrate 13 and the lead frame 15, and then the molding material 16 is injected to complete the fabrication of the packaging of the power module 100b. Accordingly, the device with low power consumption and being sensitive to heat can be integrated into the power module with less high-temperature influence from the power device, thereby improving the space availability of the power module.

Although the space availability of the power module can be enhanced by disposing the controlling device or driving device on the heat sink through thermal insulating layer, the aforementioned problems of the DBC ceramic substrate still cannot be overcome. Besides, the shell of the power module (not shown in FIG. 1b) is generally designed to be insulated to simplify the installation and selection of the heat sink. Hence, even if the material of the shell is a good electrical conductor (e.g., copper), the shell is still designed to be electrically insulated. Thus, the metal material (such as copper) in the power module is merely used to provide one single function of electrical or thermal conduction, and its electrically and thermally conductive properties are not utilized simultaneously, thus not fully utilizing the features of the material.

In sum, the conventional power modules still have various problems such as poor heat dissipating performance, material wastage, the difficulty of reliability design, not fully utilized electrical performance, the over design caused by over-emphasis on generality, and poor economic performance, etc. More particularly, the conventional power modules have insufficient space availability, and their applications in high power density or high efficiency occasions are thus restricted. In order to further increase the power density or converting efficiency of the power converter, there is a need to develop a power module with high space availability and reasonable cost.

SUMMARY

To solve the above problems, the present disclosure provides a power module with higher space availability, in which the power module is formed by disposing planar power devices directly on a heat-dissipating substrate, thereby not only effectively increasing the space availability but also saving the cost of additionally a DBC ceramic substrate and also increasing the heat dissipation of the power module such that the high power density or high efficiency of a power converter can be achieved, and the electric energy conversion efficiency of the power converter can be effectively enhanced.

An aspect of this disclosure provides a power module. The power module includes a heat-dissipating substrate, a first planar power device, and a second planar power device. The first planar power device includes a plurality of electrodes on an upper surface of the first planar power device, and the second planar power device includes a plurality of electrodes on an upper surface of the second planar power device, and a lower surface of the first planar power device and a lower surface of the second planar power device are disposed above the heat-dissipating substrate.

According to another aspect of the present invention, a power converter is provided and includes the aforementioned power module, a power input terminal, and a power output terminal. The power input terminal is connected to the power module, and the power output terminal is connected to the power module. An input voltage is received by the power input terminal and converted by the power module into an output voltage outputted through the power output terminal.

According to another aspect of the present invention provides a method of manufacturing a power module, the method including: providing a first planar power device, a second planar power device and a heat-dissipating substrate, and disposing the first planar power device and the second planar power device on an upper of the heat-dissipating substrate; providing an insulating layer and disposing at least one planar device, at least one capacitor and a plurality of pins on the insulting layer; covering the heat-dissipating substrate with the insulating layer, and enabling the insulating layer to cover the first planar power device and the second planar power device; and connecting the first planar power device, the second planar power device, at least one planar device and at least one capacitor to the corresponding positions.

BRIEF DESCRIPTION OF THE DRAWINGS

The invention can be more fully understood by reading the following detailed description of the embodiment, with reference made to the accompanying drawings as follows:

FIG. 2b is a schematic top view showing a power module according to FIG. 2a;

FIG. 4b is a schematic cross-sectional view showing a power module according to FIG. 4a;

FIG. 4d is a schematic cross-sectional view showing another power module according to FIG. 4a;

FIG. 4f is a schematic cross-sectional view showing another power module according to FIG. 4a;

FIG. 4h is another schematic cross-sectional view showing a power module according to FIG. 4a;

FIG. 8b is a schematic top view showing a power module according to FIG. 8a;

FIG. 10b is a schematic top view showing a power module according to FIG. 10a;

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1A:
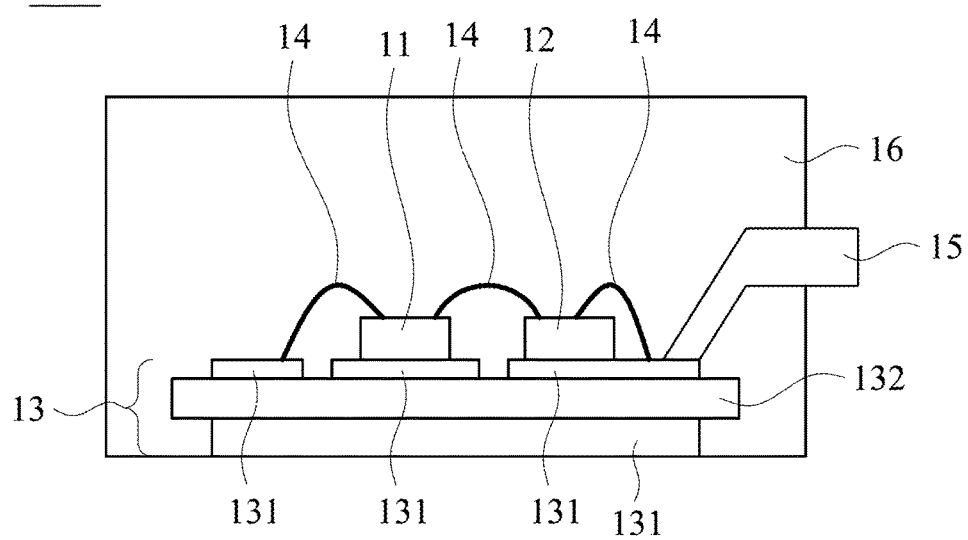
FIG. 1a is a schematic diagram showing the conventional power module.
Figure 1B:
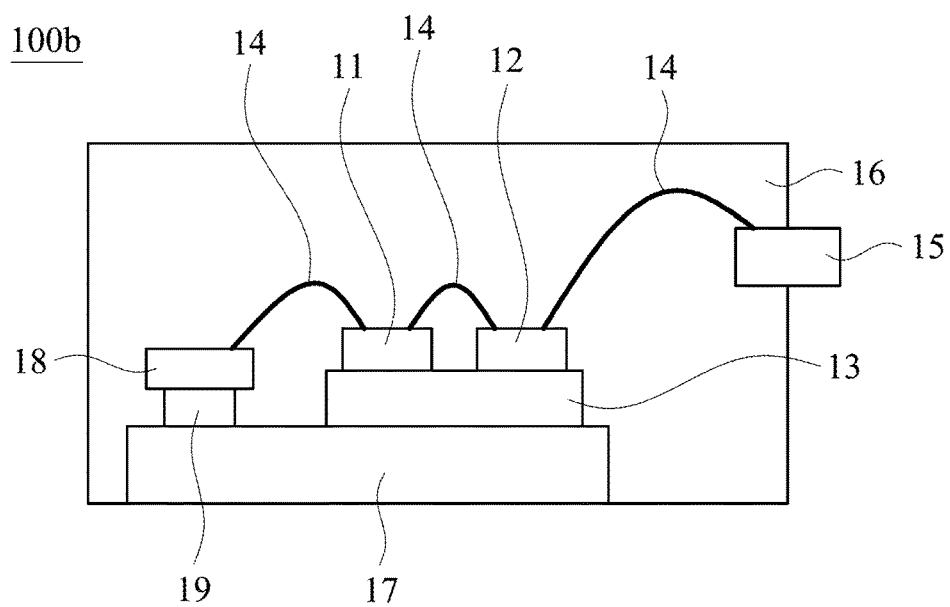
FIG. 1b is a schematic diagram showing another conventional power module.
Figure 2A:
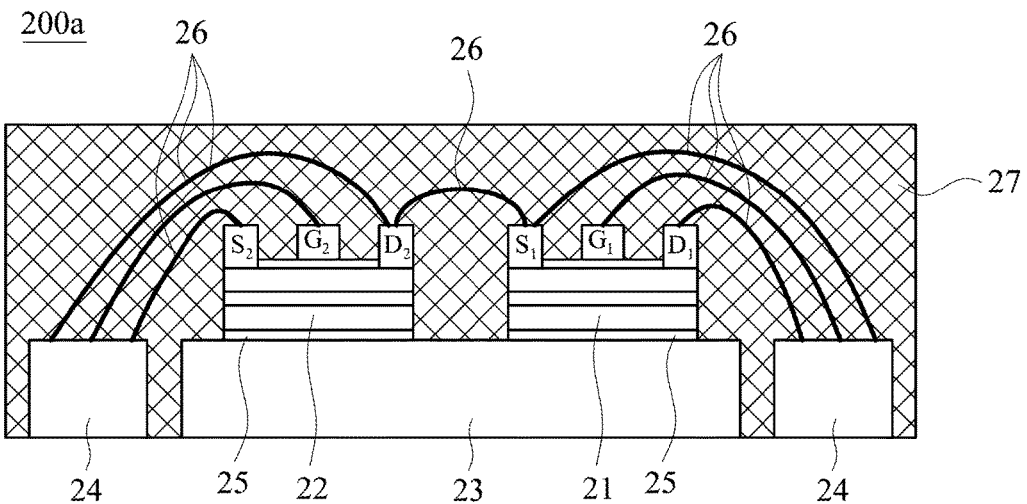
FIG. 2a is a schematic cross-sectional view showing a power module according to an embodiment of the present invention.
Figure 2B:
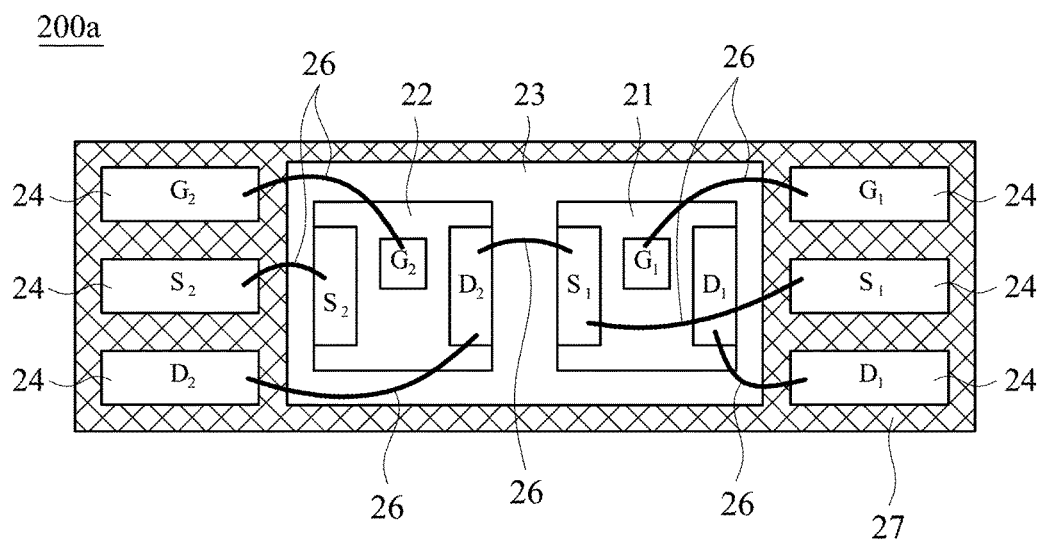

Referring to FIG. 2a and FIG. 2b, FIG. 2a is a schematic cross-sectional view showing a power module 200a according to an embodiment of the present invention, and FIG. 2b is a schematic top view showing a power module 200a according to FIG. 2a. As shown in FIG. 2a and FIG. 2b, the power module 200a includes at least one first planar power device 21, at least one second planar power device 22, a heat-dissipating substrate 23 and a plurality of pins 24. For convenience and clarity of explanation, the present embodiment and the following embodiments all use two planar power devices as an example for explanation, but the embodiments are not limited thereto. A gate $G_1$ of the first planar power device 21, a drain $D_1$ and a source $S_1$ are located on an upper surface of the first planar power device 21; and a gate $G_2$ of the second planar power device 22, a drain $D_2$ and a source $S_2$ are located on an upper surface of the second planar power device 22. In an embodiment of present invention, a coating or dispensing technique is used to apply solder or an adhesive to lower surfaces of the first planar power device 21 and the second planar power device 22. The lower surface of the first planar power device 21 and the lower surface of the second planar power device 22 are disposed on the heat-dissipating substrate 23 through the methods with better thermal conductive capabilities such as soldering, bonding or the like. The heat-dissipating substrate 23 can be a heat sink made from an electro-conductive material, such as copper, aluminum, graphite or the like. In this embodiment, the first planar power device 21 and the second planar power device 22 are integrated with the heat-dissipating substrate 23 by solder 25, but this embodiment is not limited to this connection method. For convenient explanation, the following embodiments all use the soldering method to connect respective power devices on the heat-dissipating substrate, but the embodiments are not limited thereto.

Figure 3:
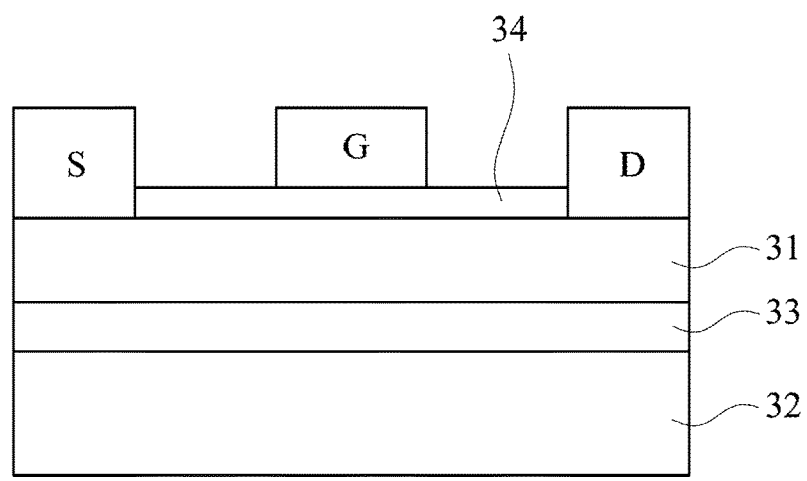
FIG. 3 is a schematic diagram showing a gallium-nitride (GaN) power device according to an embodiment of the present invention.

Referring to FIG. 3, FIG. 3 is a schematic diagram showing a gallium-nitride (GaN) power device 300 according to an embodiment of the present invention, in which the GaN power device 300 can be used as the first planar power device 21 and the second planar power device 22 in FIG. 2a and FIG. 2b. As shown in FIG. 3, the GaN power device 300 is generally a planar device, which is different from a vertical-type power device using a silicon material or silicon carbide (SiC) material. The GaN power device 300 includes three electrodes formed from a gallium-nitride (GaN) material layer 31, which are a gate G, a drain D and a source S distributed on the same plane. It is noted that, the planar device of the present invention means that all electrodes are disposed toward the same direction. In other words, all electrodes are disposed on the upper surface of the planar device, and no electrode is disposed on the lower surface of the planar device. In addition, the GaN power device 300 further includes a substrate 32. The substrate 32 is generally formed from silicon or silicon carbide for supporting the GaN material layer 31. A first insulating layer 33 is disposed between the GaN material layer 31 and the substrate 32 for providing voltage withstand capacity and electrical insulation properties for the GaN power device 300. Moreover, a second insulating layer 34 is disposed among the three electrodes for providing electrical insulation among the gate G, the drain D and the source S. Moreover, a certain extent of electrical insulation should be satisfied among the three electrodes of the GaN power device 300 and the lower surface of the substrate 32. Thus, all of the electrodes of the GaN power device 300 are disposed on the upper surface of the GaN power device 300, and the lower surface of the GaN power device 300 has the electrical insulation property and is not used for electrical conduction.

Returning to FIG. 2a and FIG. 2b, the power module 200a includes the first planar power device 21 and the second planar power device 22, in which at least one of the two planar power devices 21 and 22 is the GaN power device 300 shown in FIG. 3. In this embodiment, both of the first planar power device 21 and the second planar power device 22 are GaN power devices, but this embodiment is not limited thereto. For convenience and clarity of explanation, the first planar power device and the second planar power device in the following embodiments are GaN power devices, but the embodiments are not limited thereto.

In addition, at least one of the first planar power device 21 and the second planar power device 22 is an active power device. The so-called active power device is a power switch having a control terminal. For example, the power switch is a switch unit such as a metal-oxide-semiconductor field-effect transistor (MOSFET), an insulated gate bipolar transistor (IGBT) or the like. The other one of the planar power devices also can be an active power device, or a passive power device such as a diode. Furthermore, at least one of the two planar power devices is an active switch device with at least three electrodes.

Due to the basic insulation and stress withstand capacities existing between the electrodes of the GaN power device and the substrate, that is, an electrically insulating thermal conductor is formed inside the GaN power device, the first planar power device 21 and the second planar power device 22 can be directly disposed on the heat-dissipating substrate 23, and the first planar power device 21 and the second planar power device 22 can be connected to the upper surface of the heat-dissipating substrate 23 through the solder 25, but this embodiment is not limited to this connection method. In other words, there is no need to dispose an additional electrical insulating material between the first/ the second planar power devices 21, 22 and the heat-dissipating substrate 23, and the effect of the electrical insulation between the first planar power device 21 and the second planar power device 22 can be achieved.

In the conventional packaging process of a vertical-type power device, in order to electrically isolate two power devices, an additional electrically insulating thermal-conductor (e.g. Direct Bonded Copper, DBC) has to be disposed between the heat-dissipating substrate and the vertical-type power device. In this embodiment, the power module 200a adopts the GaN power device 300 of FIG. 3, thus omitting the additional electrically insulating thermal-conductor (e.g. Direct Bonded Copper, DBC) for isolating the two power devices from the heat-dissipating substrate in the packaging process. Thus, the structure of the power module 200a not only saves the cost of electrically insulating thermal-conductor, but also reduces the thermal resistance between the power device and the heat-dissipating substrate. In addition, the space packaging the electrically insulating thermal-conductor can be saved, and the space availability of the power module can be advantageously increased.

In FIG. 2a and FIG. 2b, the power module 200a includes a plurality of pins 24. As shown in FIG. 2b, the gate $G_1$, the drain $D_1$ and the source $S_1$ of the first planar power device 21, and the gate $G_2$, the drain $D_2$ and the source $S_2$ of the second planar power device 22 are respectively connected to the corresponding pins 24. The first/second planar power devices 21, 22 and the pins 24 can be connected to each other by wire bonding or copper strap bonding or the like. In this embodiment, for the power module 200a, bonding wires are used to connect each electrode on the first/the second planar power devices 21, 22 to the corresponding pins 24, but this embodiment is not limited thereto. Moreover, in this embodiment, the gate $G_1$, the drain $D_1$ and the source $S_1$ of the first planar power device 21, and the gate $G_2$, the drain $D_2$ and the source $S_2$ of the second planar power device 22 are electrically connected to the pins 24 of $G_1$, the pins 24 of $D_1$, the pins 24 of $S_1$, the pins 24 of $G_2$, the pins 24 of $D_2$, the pins 24 of $S_2$ through the bonding wires, and the source $S_1$ of the first planar power device 21 is electrically connected to the drain $D_2$ of the second planar power device 22 through the bonding wire 26. For convenience and clarity of explanation, the following embodiments all adopt the wire bonding to connect each device to the pin, but the embodiments are not limited thereto.

After the electrical connections between each device and the pin is completed, a molding material is injected to cover an area desired to be protected in the packaging process, so as to achieve dustproof, moisture-proof, and electrical insulation functions. For convenience and clarity of explanation, this step will be described again in the following embodiments.

Figure 2C:
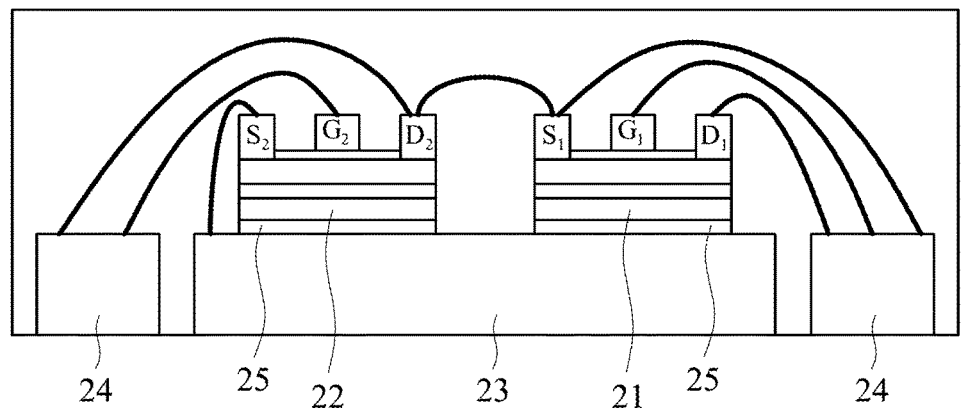
FIG. 2c is a schematic cross-sectional view showing a power module according to an embodiment of the present invention.
Figure 2D:
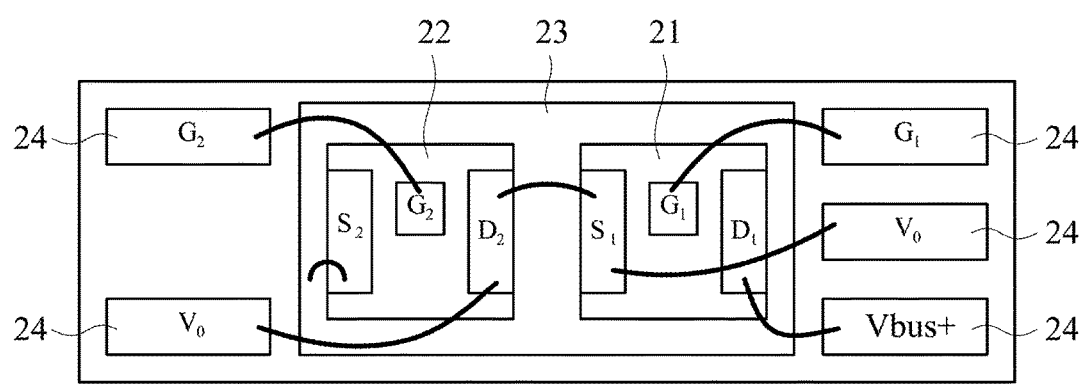
FIG. 2d is a schematic top view showing a power module according to FIG. 2c.

Because the heat-dissipating substrate 23 is a good electrical conductor, it also can be used as a large area electrode. Referring to FIG. 2c and FIG. 2d, FIG. 2c is a schematic cross-sectional view showing a power module 200b according to an embodiment of the present invention, and FIG. 2d is a schematic top view showing a power module 200b according to FIG. 2c. In FIG. 2c and FIG. 2d, the source $S_2$ of the second planar power device 22 is directly connected to the heat-dissipating substrate 23 through the wire bonding 26 but not connected to the corresponding pin 24, and thus the amount of the required pins 24 of the power module 200b can be reduced. Further, because the electrical resistance and inductance of the heat-dissipating substrate 23 used as an electrode are very small, when the source S2 of the second planar power device 22 is directly connected to the heat-dissipating substrate 23, not only the space availability of the power module 200b can be increased, but also the electrical property can be improved.

It is noted that, when the heat-dissipating substrate 23 is not used as an electrode, the heat-dissipating substrate 23 may not need to be formed from an electro-conductive material, that is, the heat-dissipating substrate 23 can also be an electrically insulating thermal conductor. However, while the heat-dissipating substrate 23 is formed from an electro-conductive material, in order to use the conductive property effectively, the heat-dissipating substrate 23 can be used as an electrode.

Figure 2E:
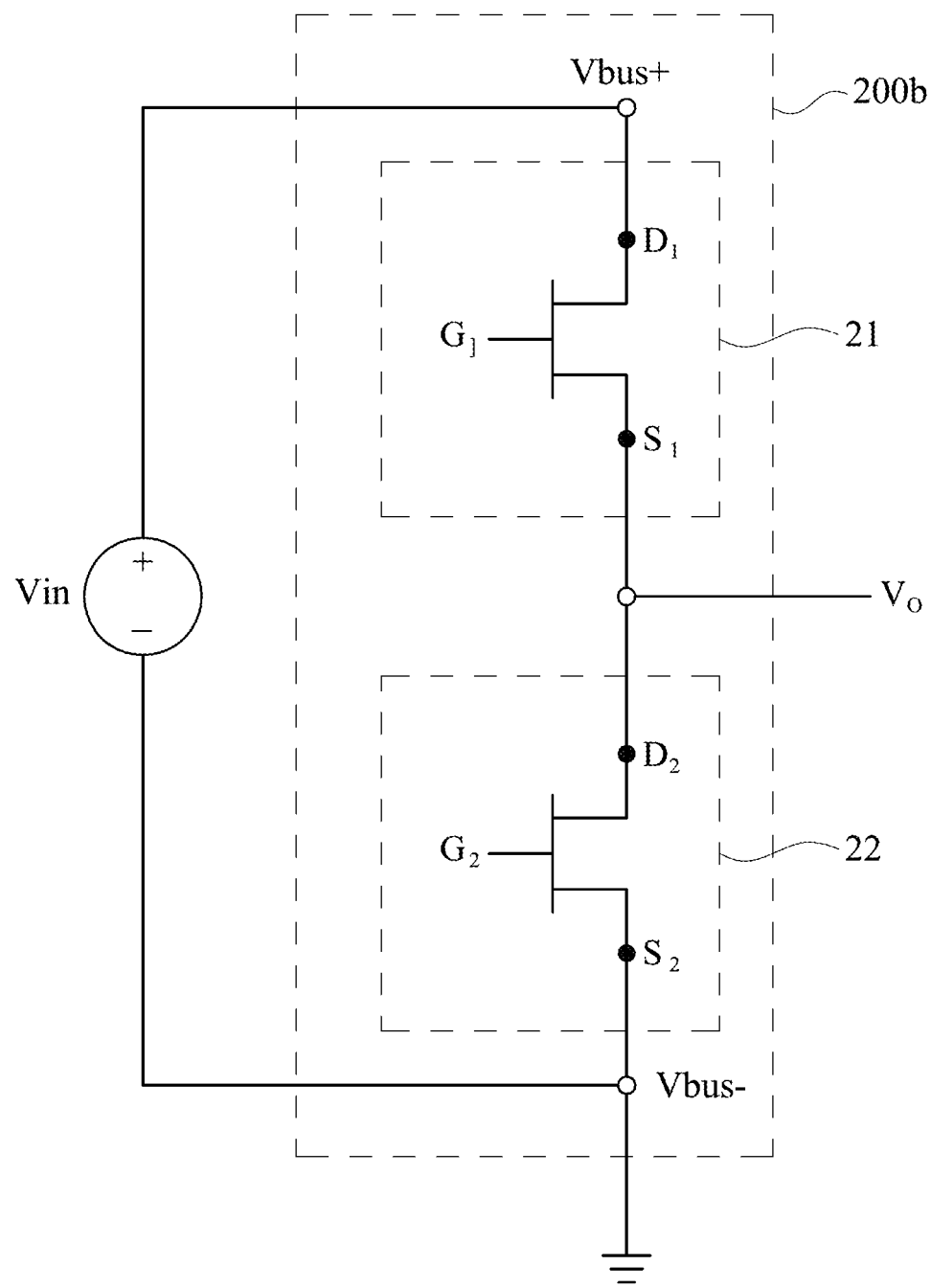
FIG. 2e shows a circuit diagram of a half-bridge converter according to an embodiment of the present invention.

Because the heat-dissipating substrate has a large area and is likely to be connected to a heat sink with a larger area outside the power module, the heat-dissipating substrate may easily form a larger capacitor with ground and become a path of electromagnetic interference. Thus, the heat-dissipating substrate should be connected to a stable electrode relative to the ground. Referring to FIG. 2e, FIG. 2e shows a circuit diagram of a half-bridge converter according to an embodiment of the present invention. As shown in FIG. 2e, the half-bridge converter is constructed by the first planar power device 21 and the second planar power device 22, in which the first planar power device 21 and the second planar power device 22 both are active switch devices. In the power module 200b, the source $S_1$ of the first planar power device 21 is connected to the drain $D_2$ of the second planar power device 22, and jointly connected to an output voltage pin Vo. In addition, the drain $D_1$ of the first planar power device 21 is connected to a first input voltage pin Vbus+, the source $S_2$ of the second planar power device 22 is connected to a second input voltage pin Vbus−, and the first input voltage pin Vbus+ and the second input voltage pin Vbus− are respectively connected to the input power Vin, so as to realize the functions of the converter.

Referring to FIG. 2d, the source $S_1$ of the first planar power device 21 and the drain D2 of the second planar power device 22 are connected to the output voltage pin Vo through the bonding wires. It should be noted that, in this embodiment, the source $S_1$ of the first planar power device 21 and the drain $D_2$ of the second planar power device 22 are connected to two output voltage pins Vo through bonding wires. In addition, the drain $D_1$ of the first planar power device 21 is connected to the first input voltage pin Vbus+ through a bonding wire, and the source $S_2$ of the second planar power device 22 is connected to the heat-dissipating substrate 23 through a bonding wire. In this embodiment, the heat-dissipating substrate 23 can be used as the second input voltage pin Vbus− in FIG. 2e. Moreover, the second input voltage pin Vbus− also can be added to the FIG. 2d (not shown in FIG. 2d), thereby connecting the source $S_2$ of the second planar power device 22 to the second input voltage pin Vbus− through a bonding wire.

Further, the heat-dissipating substrate 23 of the power module 200b also can be connected to the first input voltage pin Vbus+, that is, the drain $D_1$ of the first planar power device 21 can also be connected to the heat-dissipating substrate 23 through a bonding wire so as to be connected to the first input voltage pin Vbus+, and the source $S_2$ of the second planar power device 22 is connected to the second input voltage pin Vbus− through a bonding wire. Briefly speaking, when the heat-dissipating substrate is used as one of the electrodes of the power module, besides having good anti-electromagnetic interference capability, the space availability and heat dissipating ability are also improved. In addition, one pin used in the power module can be reduced so that the fabrication cost of the power module can be lowered.

Figure 2F:
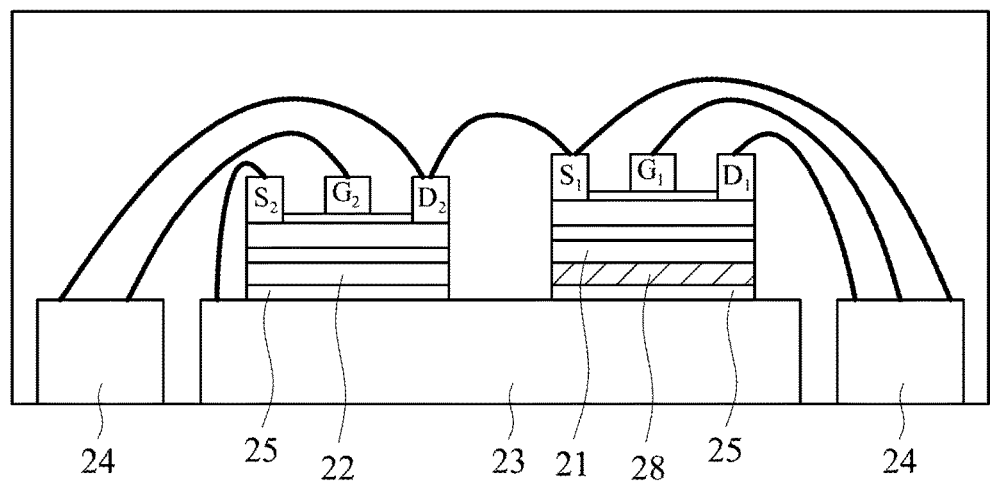
FIG. 2f is a schematic cross-sectional view showing a power module according to another embodiment of the present invention.

Further, in the power module 200b, the working voltage of the first planar power device 21 and that of the second planar power device 22 are different, and the working voltage of the first planar power device 21 is usually higher than that of the second planar power device 22 (because the first planar power device 21 directly receives the input voltage Vin). Hence, to ensure the voltage withstand capacity between the lower surface of the first planar power device 21 and its source $S_1$ to be equivalent to the voltage withstand capacity between the drain $D_1$ and the source $S_1$ of the first planar power device 21, an electrically insulating thermal conductive layer can be additionally disposed between the first planar power device 21 and the heat-dissipating substrate 23. As shown in FIG. 2f, FIG. 2f is a schematic cross-sectional view showing a power module 200c according to another embodiment of the present invention. An electrically insulating thermal conductive layer 28 is disposed between the first planar power device 21 and the heat-dissipating substrate 23, thereby preventing the first planar power device 21 from being damaged by the high voltage received by the power module 200c. In addition, because the second planar power device 22 does not directly receive the input voltage, and the voltage withstand capacity of the second planar power device 22 does not have to be the same as that of the first planar power device 21, the second planar power device 22 can be directly disposed on the heat-dissipating substrate 23.

Due to the high switching speed of the gallium-nitride (GaN) power device, the equivalent inductance of the power module after being packaged will result in more switching loss, or when the switch is off, the stability of the power module will be affected because the voltage of the power device is too high. Therefore, for designing the converter in the FIG. 2e, a capacitor is generally required to be disposed to reduce the equivalent loop inductance of the bridge in the converter.

Figure 4A:
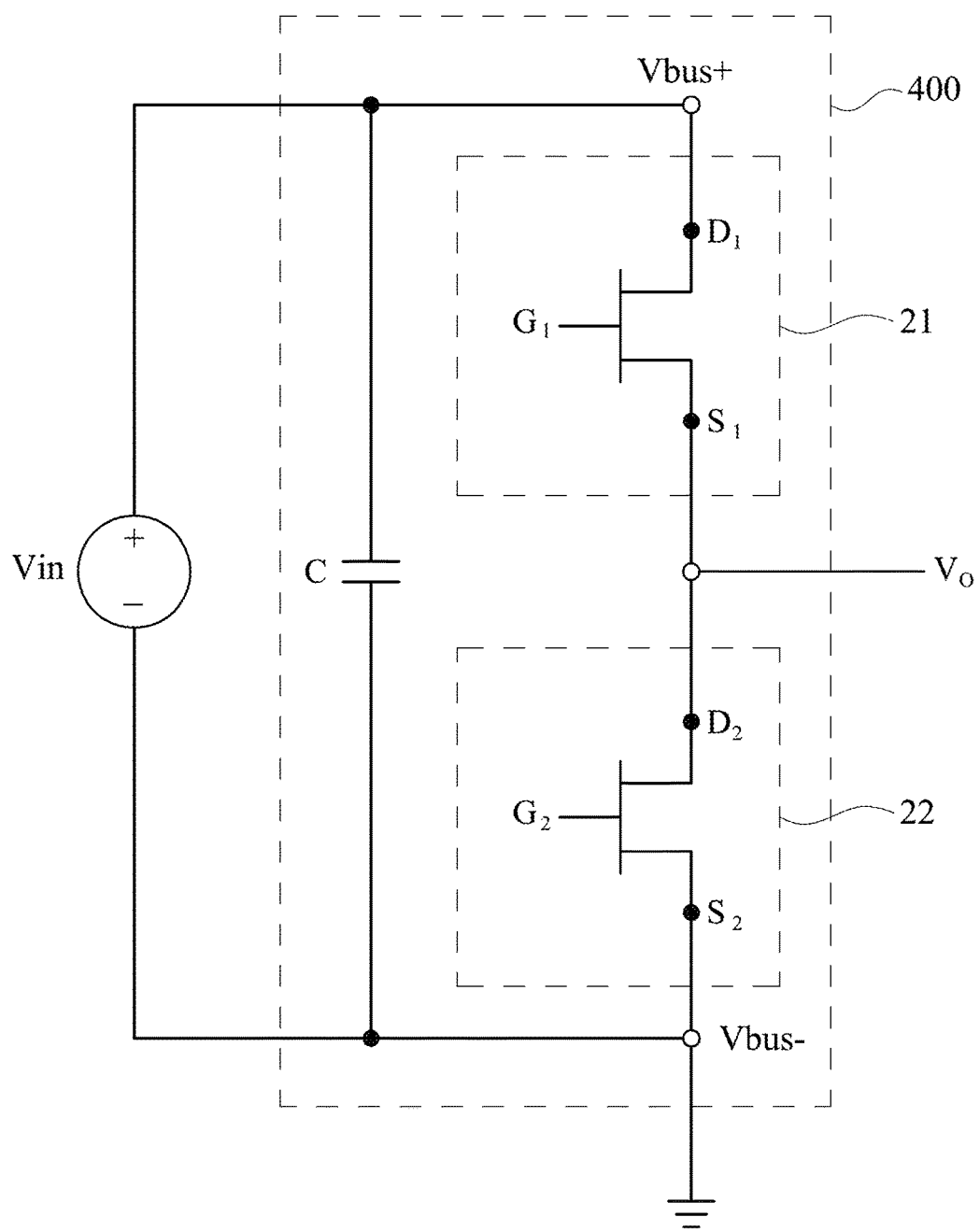
FIG. 4a shows a circuit diagram of another half-bridge converter according to an embodiment of the present invention.
Figure 4B:
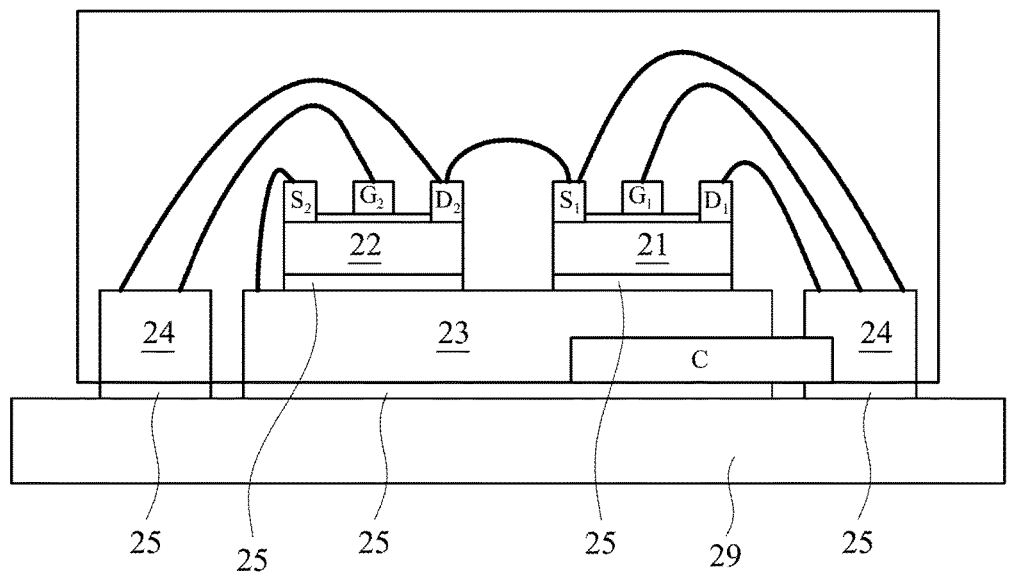
Figure 4C:
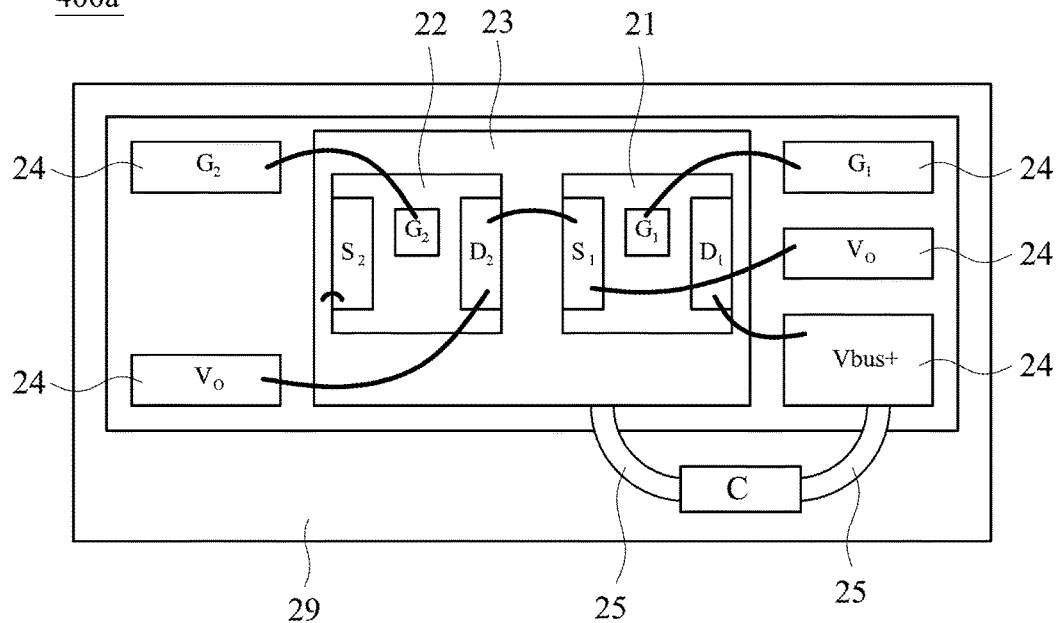
FIG. 4c is a schematic top view showing a power module according to FIG. 4b.

Referring to FIG. 4a, FIG. 4a shows a circuit diagram of another half-bridge converter according to an embodiment of the present invention. As shown in FIG. 4a, a power module 400 of a half-bridge converter further includes a capacitor C which is cross-connected to two ends of the input Vin, that is, the first input voltage end Vbus+ and the second input voltage end Vbus− and used to reduce the equivalent loop inductance of the bridge in the converter. Referring to FIG. 4b and FIG. 4c, FIG. 4b is a schematic cross-sectional view showing a power module 400a according to the power module 400 of FIG. 4a, and FIG. 4c is a schematic top view showing the power module 400a according to FIG. 4b. As shown in FIGS. 4b and 4c, the heat-dissipating substrate 23 and the pin 24 in the power module 400a are disposed on a circuit board 29 by soldering or bonding. In this embodiment, the heat-dissipating substrate 23 and the pin 24 are soldered onto the circuit board 29 through solder 25, but this embodiment is not limited to this connection method. It should be explained that the circuit board can be a print circuit board (PCB) or can be another circuit board capable of carrying electronic elements.

In addition, the capacitor C can be disposed on the upper surface or the lower surface of the circuit board 29 (in this embodiment, the capacitor C is disposed on the upper surface of the circuit board 29) and is connected between the heat-dissipating substrate 23 and the first input voltage pin Vbus+ through solder 25 (e.g. soldering). The heat-dissipating substrate 23 is also connected to the second input voltage end Vbus− (not shown in the FIG. 4c), that is, the heat-dissipating substrate 23 and the second input voltage end Vbus− are equipotential. Moreover, the capacitor C of the present embodiment is disposed near the first planar power device 21 and the second planar power device 22, such that the equivalent loop inductance formed by the capacitor C and the bridge is quite small, which generally can be reduced from several tens of nano-henries (nH) to teens of nano-henries, thus benefiting the operation of the power module 400a under high frequency.

Figure 4D:
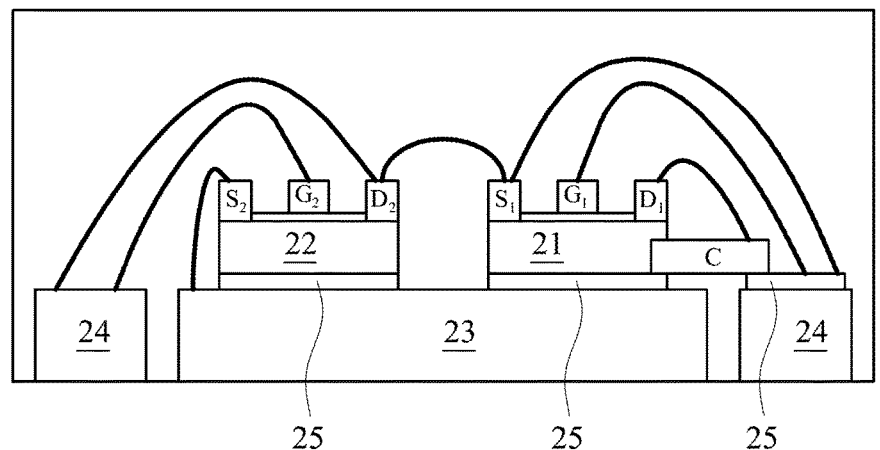
Figure 4E:
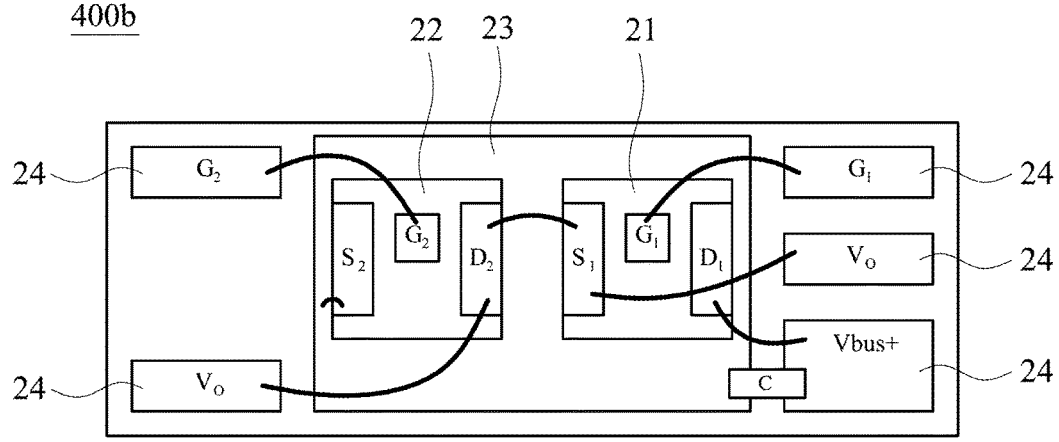
FIG. 4e is a schematic top view showing a power module according to FIG. 4d.

In order to reduce the loop inductance, referring to FIG. 4d and FIG. 4e, FIG. 4d is a schematic cross-sectional view showing another power module 400b according to the power module 400 of FIG. 4a, and FIG. 4e is a schematic top view showing the power module 400b according to FIG. 4d. As shown in FIG. 4d and FIG. 4e, the capacitor C is further directly disposed on the heat-dissipating substrate 23 and the first input voltage pin Vbus+, and the capacitor C is soldered onto the heat-dissipating substrate 23 and the first input voltage pin Vbus+ through solder 25. Moreover, in the present embodiment, the position of the capacitor C disposed on the first input voltage end Vbus+ and the second input voltage end Vbus− of the half-bridge converter is much nearer the first planar power device 21 and the second planar power device 22, compared to the position of the capacitor C disposed on the power module 400a in FIG. 4a and FIG. 4b. Therefore, its loop inductance can further be reduced to be generally less than ten nano-henries.

Although the equivalent inductance of the power module 400b has been greatly improved. However, a GaN device is usually constructed by tens of thousands of GaN cells, and the loop sizes formed by each area of the GaN device and the capacitor C (as shown in FIG. 4d) are different from each other, which may easily result in the inconsistent switching speed of each GaN cell in the switching process and affects the performance of the power module 400b. Hence, in the packaging design, not only to reduce the loop inductance of the power module, but also how to equally distribute each loop should be considered.

Figure 4F:
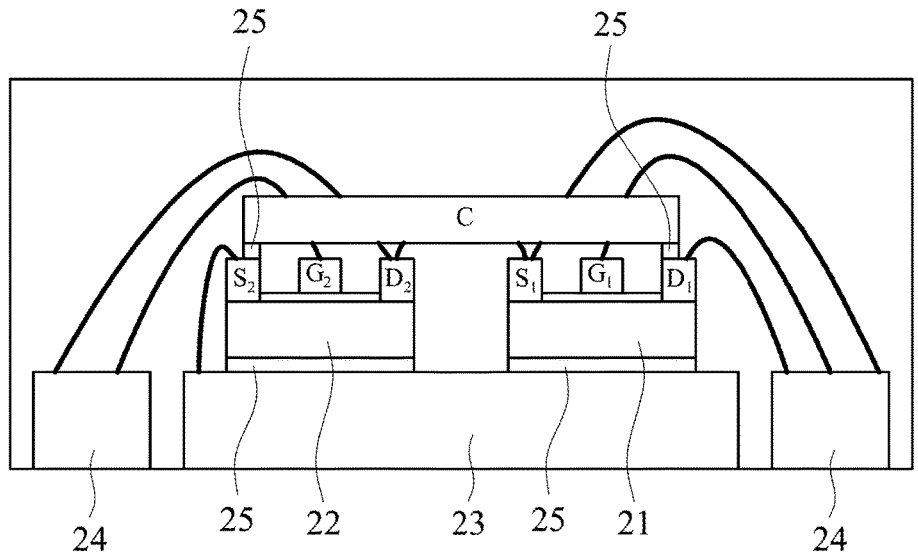
Figure 4G:
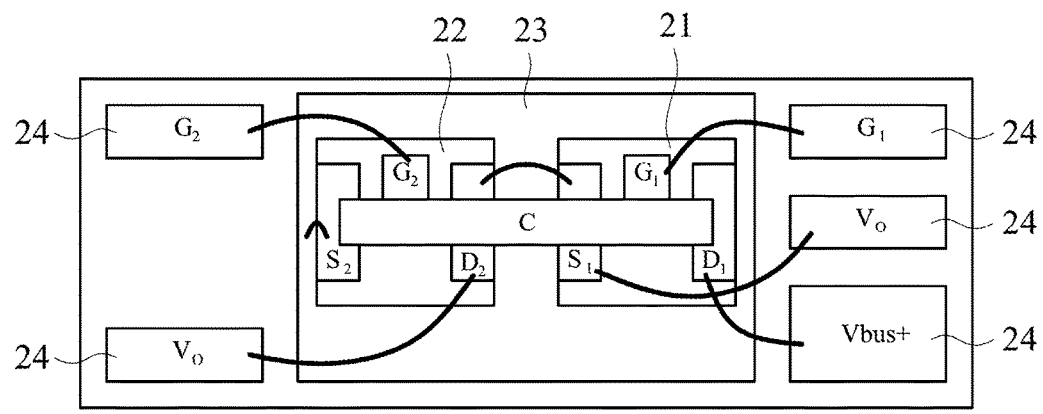
FIG. 4g is a schematic top view showing a power module according to FIG. 4f.

Referring to FIG. 4f and FIG. 4g, FIG. 4f is a schematic cross-sectional view showing another power module 400c according to the power module 400 of FIG. 4a. FIG. 4g is a schematic top view showing the power module 400c according to FIG. 4f. As shown in FIG. 4f and FIG. 4g, the capacitor C is directly disposed on the upper surface of the first planar power device 21 and the upper surface of the second planar power device 22. One end of the capacitor C is directly connected to the drain $D_1$ of the first planar power device 21, and the other end of the capacitor C is directly connected to the source $S_2$ of the second planar power device 22. Thus, not only the loop inductance is reduced, but also the uniformity of the circuit is also ensured. In this embodiment, the equivalent loop inductance of the power module 400c can be further reduced less than one nano-henry.

Figure 4H:
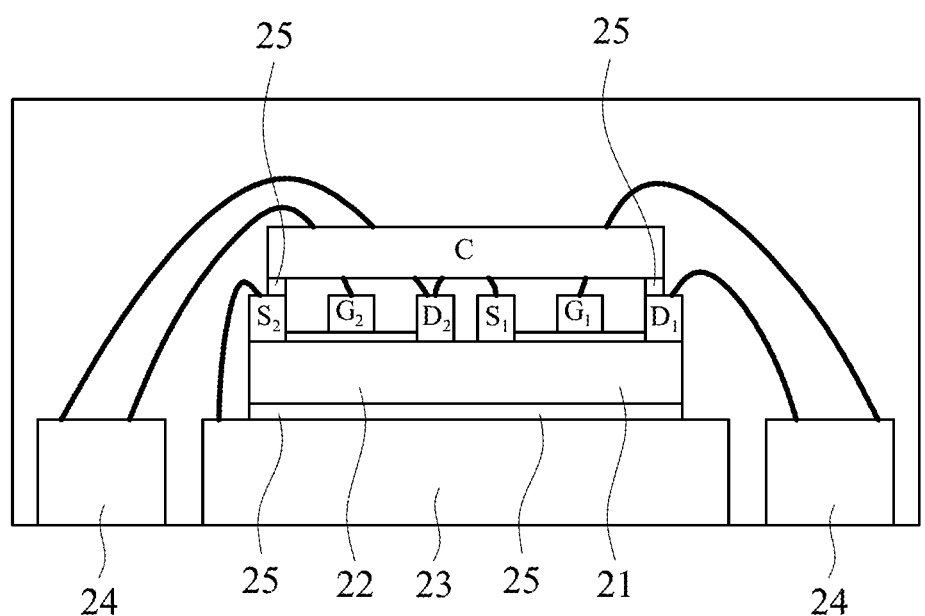

Referring to FIG. 4h, FIG. 4h is a schematic cross-sectional view showing another power module 400d according to the power module 400 of FIG. 4a. As shown in FIG. 4h, the first planar power device 21 and the second planar power device 22 of the power module 400d are disposed on the same chip, that is, the two planar power devices are not divided in a wafer. In this embodiment, the adjacent first/second planar power devices 21 and 22 are directly disposed on the heat-dissipating substrate 23, and the capacitor C is directly disposed on the upper surface of the first planar power device 21 and the upper surface of the second planar power device 22, similar to the capacitor disposition of the power module 400c in the FIG. 4f. One end of the capacitor C is directly connected to the drain $D_1$ of the first planar power device 21, and the other end of the capacitor C is directly connected to the source $S_2$ of the second planar power device 22.

In the same chip, because two adjacent planar GaN power devices still have electrical insulation features, the two adjacent planar GaN power devices are cut together and not divided during wafer cutting, that is, the two planar GaN power devices are disposed on the same chip and are spaced from each other at a smallest distance, as shown in FIG. 4h. Therefore, the space availability of the power module 400d can be improved, and the current may evenly flow in the smallest loop via the stacking of the capacitor C, thereby greatly improving the equivalent loop inductance.

The GaN device is generally a normally-on device, meaning that the normally-on device is conducted (on) when no control signal is provided. It also represents that, when the power module is under a standby mode, a current through each device of the power module is likely to be generated. If the unexpected current through a device is too large, the device in the power module may be further damaged. Hence, in order to ensure the power module using the normally-on device to be more stable, the normally-on device is usually used with a conventional switching device (i.e. a normally-off device). That is, the normally-off device is open (off) when no control signal is provided, thereby enhancing the stability of the operation of the power module.

Figure 5A:
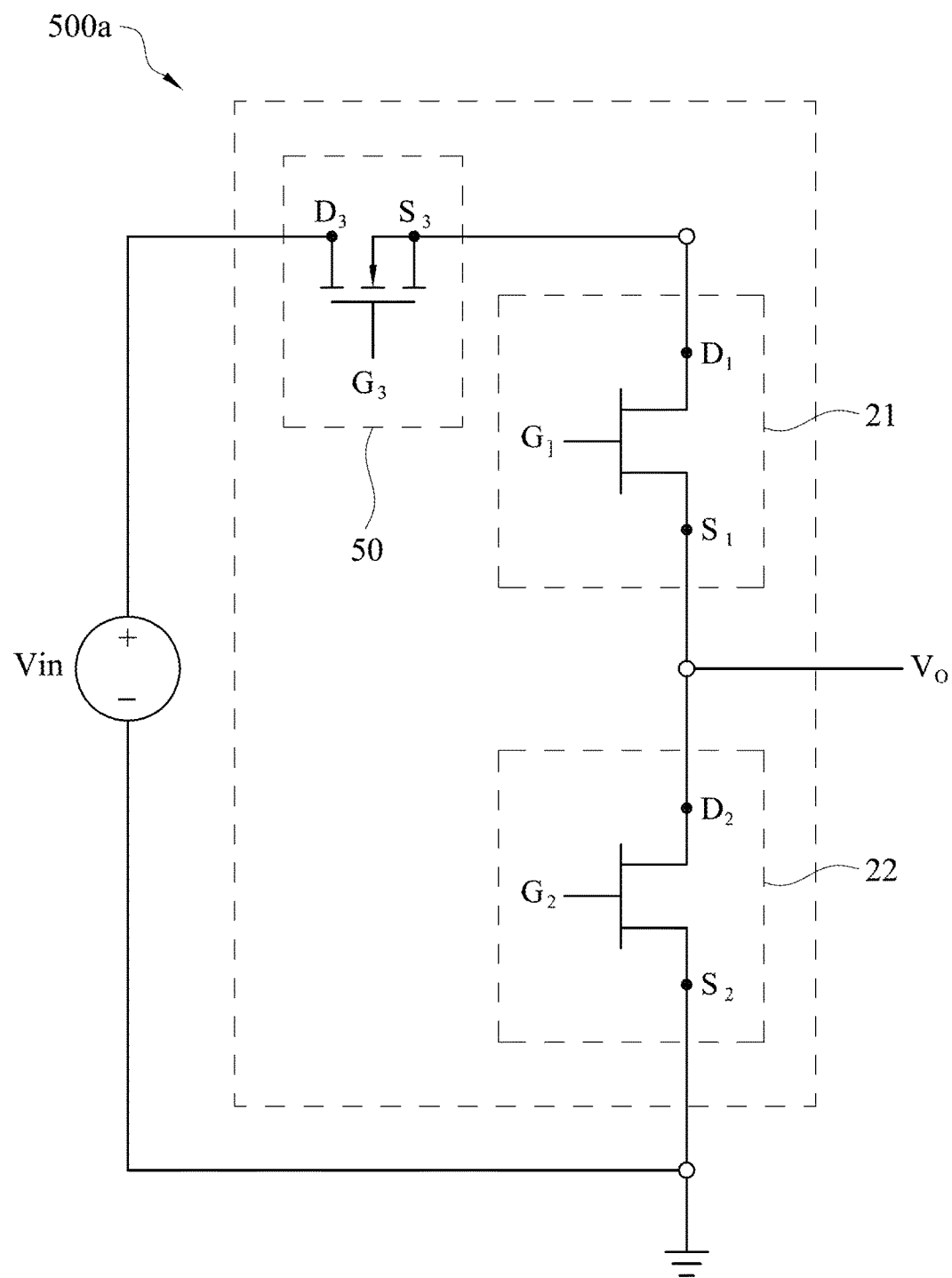
FIG. 5a shows a circuit diagram of half-bridge converter according to an embodiment of the present invention.

Referring to FIG. 5a, FIG. 5a shows a circuit diagram of a half-bridge converter according to an embodiment of the present invention. As shown in FIG. 5a, a power module 500a in the half-bridge converter includes the first planar power device 21, the second planar power device 22, and a switching device 50. The drain $D_3$ of the switching device 50 is connected to one end of the input Vin, and the source $S_3$ is connected to the drain $D_1$ of the first planar power device 21. The drain $S_1$ of the first planar power device 21 is connected to the drain $D_2$ of the second planar power device 22, and the source $S_2$ of the second planar power device 22 is connected to the other end of the input source Vin (that is, a ground end). The source $S_1$ of the first planar power device 21 and the drain $D_2$ of the second planar power device 22 are connected to the output end Vo.

In this embodiment, at least one of the first planar power device 21 and the second planar power device 22 is a normally-on GaN device. In this embodiment, the first planar power device 21 and the second planar power device 22 are both normally-on devices, but this embodiment is not limited thereto. The switching device 50 is a normally-off device, generally such as a metal-oxide-semiconductor field-effect transistor (SiMOS, referred to as a silicon device). It is noted that GaN device can also be implemented as a normally-off device, meaning that the switching device 50 can also be a normally-off GaN device. If not specifically described in the following embodiments, the normally-off devices are regarded as commonly seen silicon devices.

The first planar power device 21, the second planar power device 22, and the switching device 50 are all high voltage devices, that is, the first planar power device 21, the second planar power device 22 and the switching device 50 can independently resist the high voltage input source Vin. While the first planar power device 21 and the second planar power device 22 are not under a working mode, the switching device 50 is controlled at an off state to prevent high flowing current from damaging the devices when the first planar power device 21 and the second planar power device 22 are in an on state. While the first planar power device 21 and the second planar power device 22 are conducted (on), the switching device 50 is controlled at the on state to lower the power consumption of the power module 500a. Moreover, the first planar power device 21 and the second planar power device 22 are operated at a relatively high frequency, and the switching device is operated at a relatively low frequency.

Figure 5B:
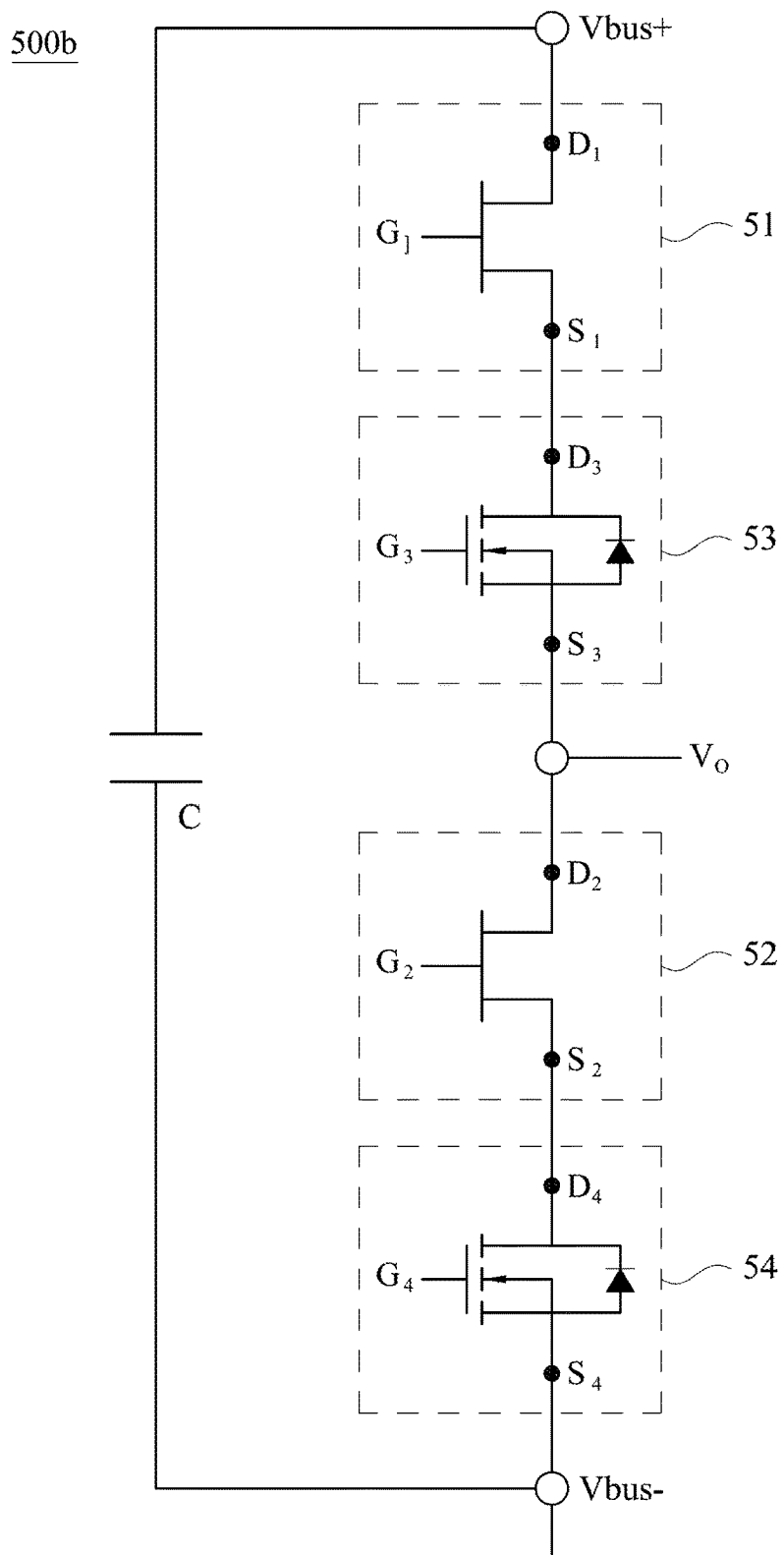
FIG. 5b shows a circuit diagram according to an embodiment of the present invention.

Referring to FIG. 5b, FIG. 5b shows a circuit diagram of a power module 500b according to an embodiment of the present invention. As shown in FIG. 5b, the power module 500b includes a first planar power device 51, a second planar power device 52, a first switching device 53, a second switching device 54 and a capacitor C. Similarly, the first planar power device 51 and the second planar power device 52 are both normally-on GaN devices, and the first switching device 53 and the second switching device 54 are normally-off silicon device (e.g. a metal-oxide-semiconductor field-effect transistor, SiMOS). The source $S_1$ of the first planar power device 51 is connected the drain $D_3$ of the first switching device 53 in series. The source $S_3$ of the first switching device 53 is connected to the drain $D_2$ of the second planar power device 52 in series. The source $S_2$ of the second planar power device 52 is connected to the drain $D_4$ of the second switching device 54 in series. The drain $D_1$ of the first planar power device 51 is connected to the first input voltage end Vbus+. The source $S_4$ of the second switching device 54 is connected to the second input voltage end Vbus−. One end of the capacitor C is connected to the first input voltage end Vbus+, and the other end is connected to the second input voltage end Vbus− (that is, a ground end). The source of the first switching device 53 is connected to the drain of the second planar power device 52 and the output end Vo.

Because the first switching device 53 and the second switching device 54 are respectively connected to the source $S_1$ of the first planar power device 51 and the source $S_2$ of the second planar power device 52 in series, their working voltage is relatively low (which is the maximum gate voltage of the GaN device, generally lower than 20 volts), and the first switching device 53 and the second switching device 54 are both low voltage devices unlike the power module 500a, so as to further reduce the power consumption of the power module 500b.

Moreover, the first/second planar power devices 51, 52 in the power module 500b and the first/second switching device 53, 54 can be operated in two modes. The first mode is that the first/second planar power devices 51, 52 and the first/second switching devices 53, 54 are operated in a high frequency mode concurrently. Accordingly, the first planar power device 51 and the second planar power device 52 can be controlled by directly controlling the first switching device 53 and the second switching device 54. The second mode is that the first/second planar power device 51, 52 are operated in the high frequency mode, but the first/second switching devices 53, 54 are operated in a low frequency mode, like the working mode of the power module 500a. In the second mode, the first/second switching device 53, 54 are controlled in the off state when the first/second planar power device 51, 52 are not in the working state, and the first/second switching device 53, 54 are controlled in the on-state when the first/second planar power device 51, 52 are in the normal working state, so as to lower the loss. However, this controlling method is relatively complicated.

Figure 6:
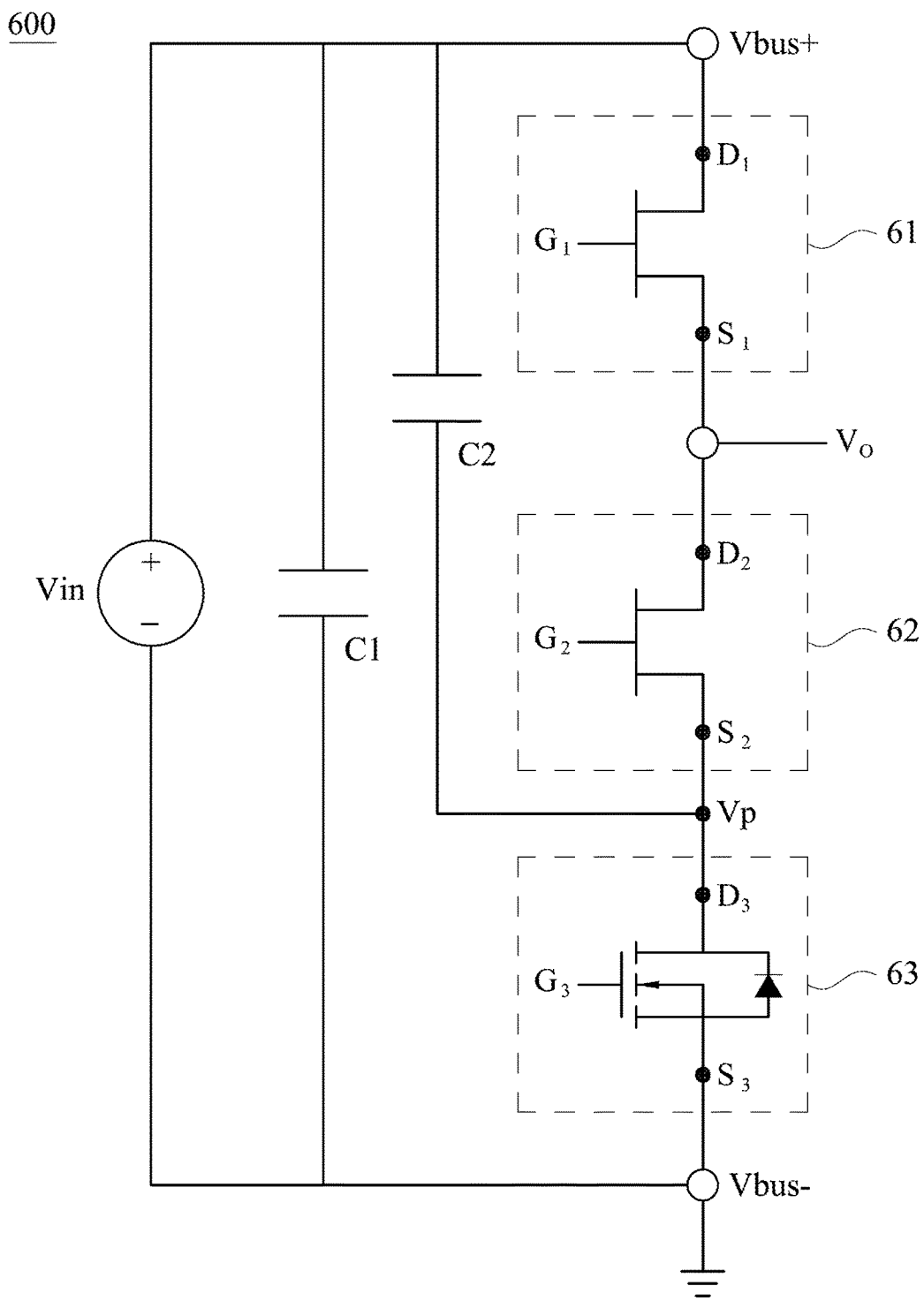
FIG. 6 shows a circuit diagram of a power module according to an embodiment of the present invention.

Referring to FIG. 6, FIG. 6 shows a circuit diagram of a power module 600 according to an embodiment of the present invention. As shown in FIG. 6, the power module 600 includes a first planar power device 61, a second planar power device 62, a switching device 63, a first capacitor C1 and a second capacitor C2. The first planar power device 61, the second planar power device 62 and the switching device 63 are connected in series. The first capacitor C1 is electrically connected to the drain $D_1$ of the first planar power device 61 and the source $S_3$ of the switching device 63. The second capacitor C2 is electrically connected to the drain $D_1$ of the first planar power device 61 and the source $S_2$ of the second planar power device 62.

Similarly, at least one of the first planar power device 61 and the second planar power device 62 is the normally-on GaN device, and the switching device 63 is the normally-off silicon device. In addition, the first planar power device 61 and the second planar power device 62 are high voltage devices, and their voltage withstand capacities are approximately the same and are two times greater than the voltage withstand capacity of the switching device 63. Because the first/second planar power devices 61, 62 are high voltage devices, which can independently resist the input voltage, only one switching device 63 is needed to help the planar power devices keep under the off state when the first/second planar power devices 61, 62 are not operated yet.

When the switching device 63 is operated under the low frequency mode, the loop inductance can be lowered by integrating the second capacitor C2. When the switching device 63 is operated under the high frequency mode, the loop inductance can be lowered by integrating the first capacitor C1. However, compared to the power module 500b in FIG. 5b, the loop of the power module 600 is involved in fewer devices (one normally-off silicon device less), hence its equivalent loop inductance can be reduced by 20% or more, which is beneficial for the power module operated under high frequency.

Figure 7:
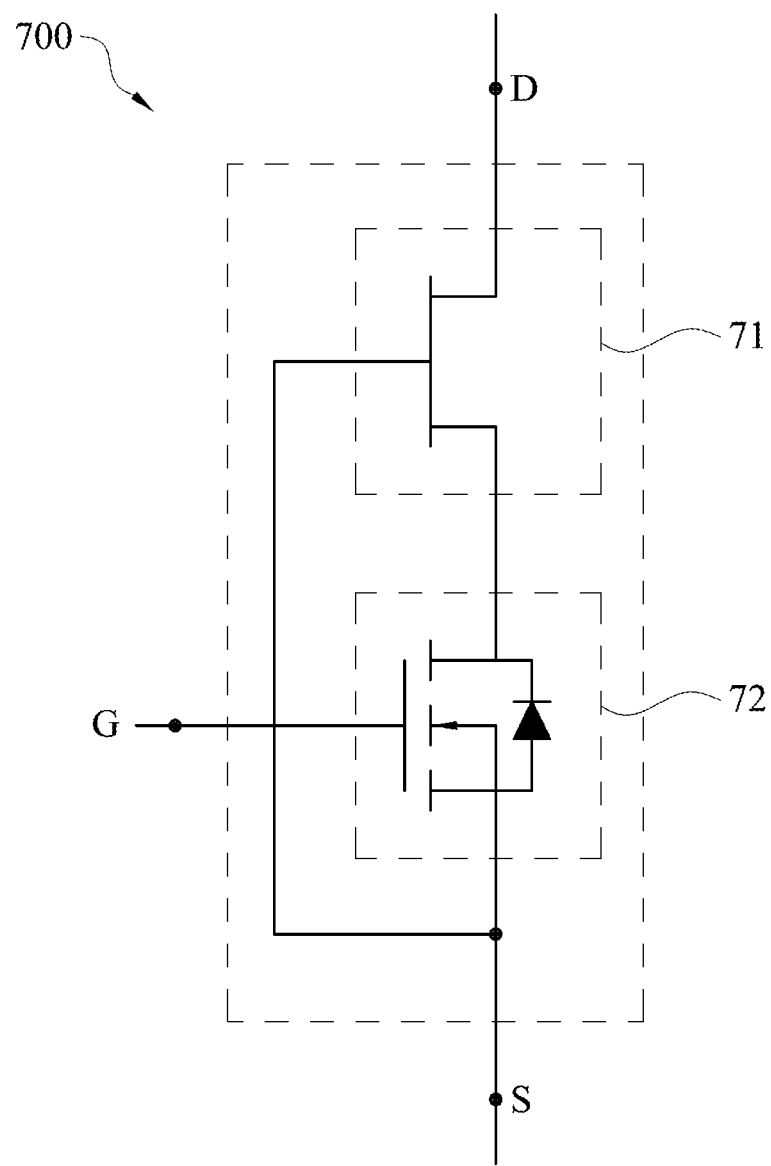
FIG. 7 shows a circuit diagram of a switching device according to an embodiment of the present invention.

It is noted that, from FIG. 5a to FIG. 6, the packaging process of each power module includes at least two normally-on GaN chips with at least one normally-on silicon chip to form a bridge of the converter. By using a combination of chips to implement a functional device, the combination can be regarded as a device, as shown in FIG. 7. FIG. 7 shows a circuit diagram of a switching device 700 according to an embodiment of the present invention, in which the switching device 700 is implemented by a combination of a high voltage normally-on GaN chip 71 and a low voltage normally-off silicon chip 72. Although the switching device 700 includes two different devices, but the equivalent function of the switching device 700 is still the normally-off device, and hence still can be used as a device.

Figure 8A:
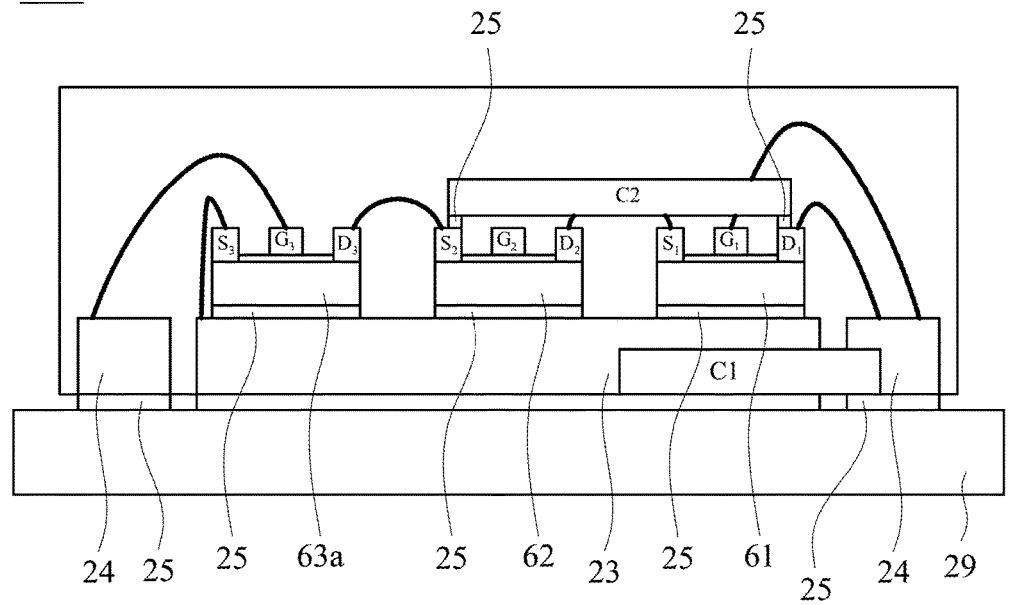
FIG. 8a is a schematic cross-sectional view showing a circuit diagram according to FIG. 6.
Figure 8B:
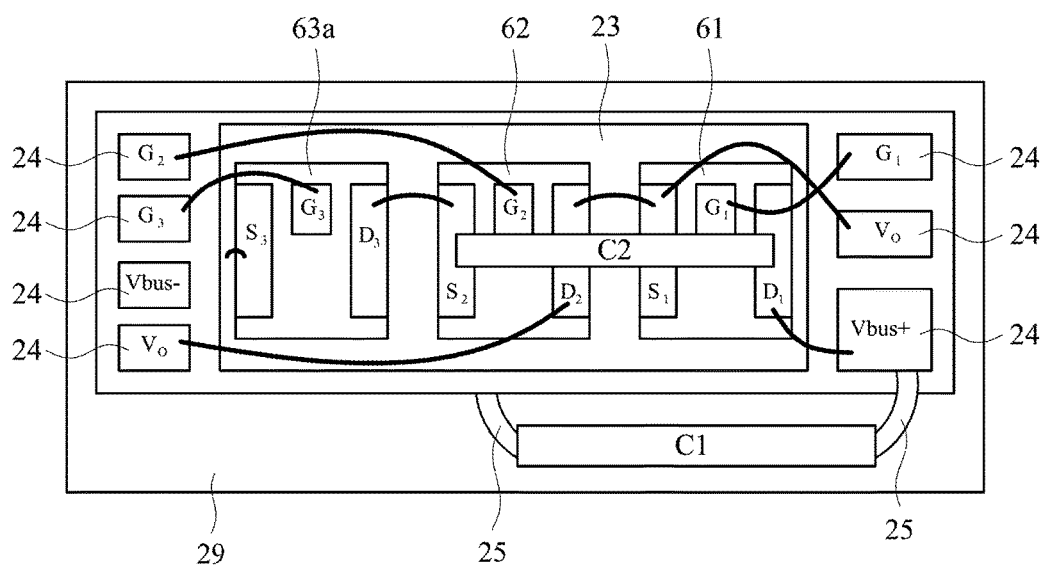

Referring to FIG. 6, FIG. 8a and FIG. 8b, FIG. 8a is a schematic cross-sectional view of a power module 800a according to the circuit diagram of FIG. 6, and FIG. 8b is a top view showing a power module 800a according to FIG. 8a. It should be noted that, in this embodiment, the switching device 63a is also a planar device. Accordingly, in FIG. 8a and FIG. 8b, the first planar power device 61, the second planar power device 62 and the switching device 63a are respectively in parallel and directly disposed on the heat-dissipating substrate 23. The drain $D_3$ of the switching device 63a is connected to the source $S_2$ of the second planar power device 62. The drain $S_3$ of the switching device 63a is connected to the heat-dissipating substrate 23, and meanwhile the heat-dissipating substrate 23 is used as the second input voltage pin Vbus− (not shown in FIG. 8a and FIG. 8b), in which the electric potential is the potential of the second voltage input end Vbus−. The drain $D_2$ of the second planar power device 62 is connected to the source $S_1$ of the first planar power device 61, and each electrode in the each device is connected to the corresponding pin 24, in which their connections can be accomplished though wire bonding.

In addition, the power module 800a further includes a circuit board 29, and the heat-dissipating substrate 23 and the pin 24 are disposed on the circuit board 29. It is noted that, the capacitor C1 and C2 of the power module 800a can be disposed by any method described in the aforementioned embodiments, and this embodiment is not limited thereto. In this embodiment, the first capacitor C1 is disposed on the circuit board 29. It is noted that, the capacitor C1 can be disposed on the upper surface or lower surface of the circuit board 29. In this embodiment, the capacitor C1 is disposed on the upper surface of the circuit board 29, but is not limited thereto. In addition, one end of the first capacitor C1 is connected to the heat-dissipating substrate 23 through the solder 25, and the other end thereof is connected to the first input voltage pin Vbus+ through the solder 25, and the first capacitor C1 is disposed near the first planar power device 21 and the second planar power device 22. The second capacitor C2 is disposed on the upper surface of the first planar power device 61 and the upper surface of the second planar power device 62, and is directly connected to the drain $D_1$ of the first planar power device 61 and the source $S_2$ of the second planar power device 62 respectively.

In the circuit of FIG. 6, the switching device 63 is located at the low voltage end, and hence, in FIG. 8a one of two power electrodes (that is, the source $S_3$ and the drain $D_3$) of the switching device 63a can be connected to the heat-dissipating substrate 23 to reduce the influence of electromagnetic interference. Besides, there is no other normally-off silicon device disposed on the high voltage position in the power module 600, and thus, the bottom of the switching device 63a in the power module 800a will not have the problems of insufficient voltage withstand capacity (because the switching device 63a is the low voltage device).

Figure 8C:
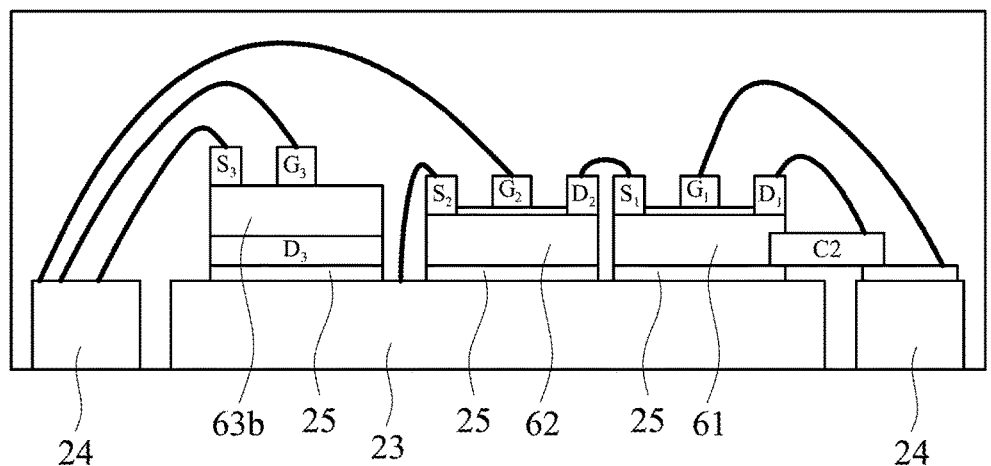
FIG. 8c is a schematic cross-sectional view of a power module according to the circuit diagram of FIG. 6.

Referring to FIG. 8c, FIG. 8c is a schematic cross-sectional view of a power module 800b according to a circuit diagram of FIG. 6. In this embodiment, a vertical-type device (like vertical-type Si MOS) is applied to the switching device 63b, meaning that not all electrodes of the vertical-type device are disposed on the same plane. In this embodiment, the gate $G_3$ and the source $S_3$ of the switching device 63b are located on the upper surface of the switching device 63b, and the drain $D_3$ is located at the bottom of the switching device 63b. As shown in FIG. 8c, while the switching device 63b is directly disposed on the heat-dissipating substrate 23, the electric potential of the heat-dissipating substrate 23 connected to the drain $D_3$ is equivalent to the electric potential Vp in the circuit diagram shown in FIG. 6 because the bottom of the switching device is the drain $D_3$. In FIG. 6, the voltage of the switching device 63 is relatively low, and thus, when the power module 600 is operated, the switching device 63 is generally conducted, and its potential Vp can be regarded as a relatively stable potential, and hence the influence of the electromagnetic interference can be ignored. In addition, the potential of the heat-dissipating substrate 23 in the power module 800b is configured at the potential Vp, and the first planar power device 61, the second planar power device 62 and the switching device 63b are disposed in parallel directly on the heat-dissipating substrate 23, and the source of the second planar power device 22 is connected to the heat-dissipating substrate 23, thereby the loop length of the power module 800b is efficiently reduced so as to lower its equivalent loop inductance. Furthermore, the pins 24 also include another output voltage pin (not shown in FIG. 8b), in which the source of the second planar power device 62 is electrically connected to another output voltage pin for providing another output voltage end to the power module 800b.

In this embodiment, only the arrangement method of the second capacitor C2 is shown, and the first capacitor C1 (not shown in FIG. 8b) can be disposed by any arrangement method described in the aforementioned embodiments, which will not be repeated herein. In this embodiment, the second capacitor C2 is disposed on the upper surface of the heat-dissipating substrate 23 and the pin 24 (i.e. the first input voltage pin Vbus+), but the embodiment is not limited thereto.

Figure 8D:
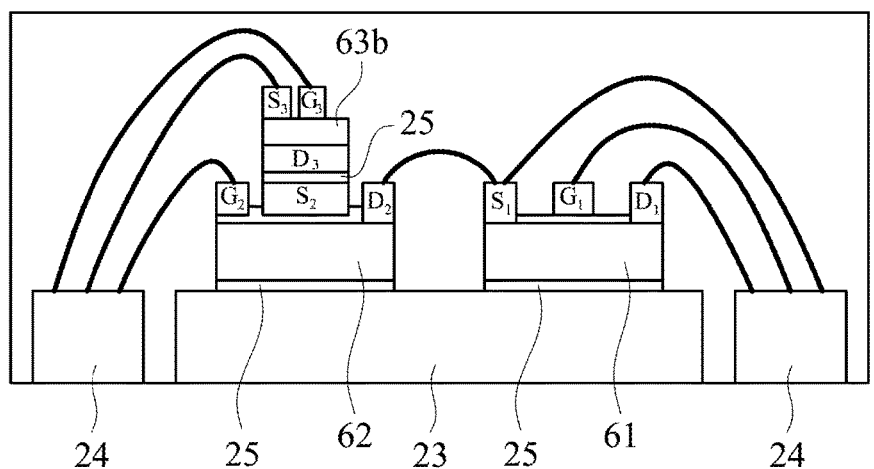
FIG. 8d is a schematic cross-sectional view of a power module according to the circuit diagram of FIG. 6.

Because the switching device paired with GaN power device is generally a silicon power device, and the silicon power device is generally a low voltage device, the voltage withstand capacity between its substrate and electrodes cannot match with that of the GaN power device. Hence, a portion of the switching devices can be separately mounted. Because the switching devices are merely disposed for collaborating with the switching control of the GaN power device, and the loss thereof is relatively small, the heat dissipating requirement does not need to be considered. Referring to FIG. 8d, FIG. 8d is a schematic cross-sectional view of a power module 800c according to a circuit diagram of FIG. 6. As shown in FIG. 8d, the drain $D_3$ of the switching device 63b is directly connected to the source $S_2$ of the second planar power device 62, thereby utilizing space effectively. In addition, in FIG. 8d, the first capacitor C1 and the second capacitor C2 are not shown in the power module 800c, but the first capacitor C1 and the second capacitor C2 can be disposed by any arrangement method described in the aforementioned embodiments, and are not illustrated again herein.

Figure 9:
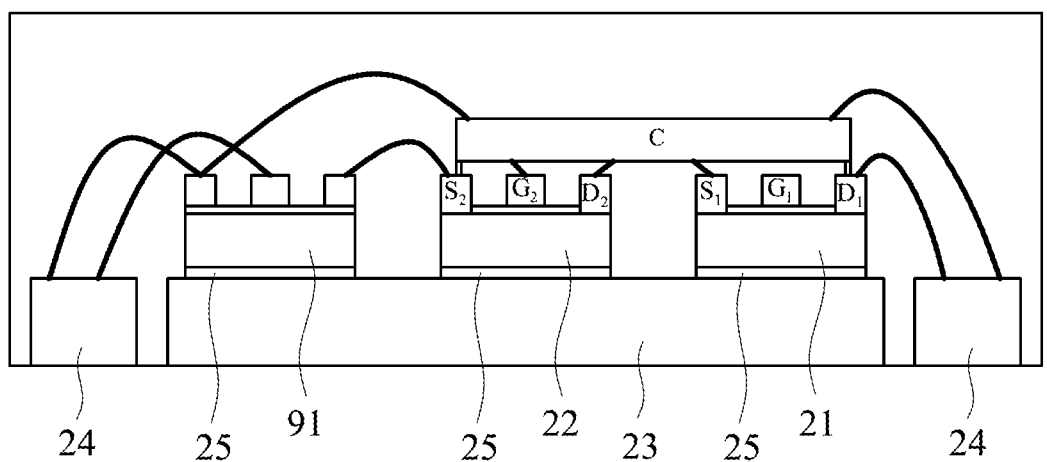
FIG. 9 is a schematic cross-sectional view showing a power module according to an embodiment of the present invention.

Referring to FIG. 9, FIG. 9 is a schematic cross-sectional view showing a power module 900 according to an embodiment of the present invention. The power module 900 also includes at least one planar device 91. For convenience and clarity of explanation, in FIG. 9 only a planar device 91 is shown, but the embodiment is not limited thereto. The planar device 91 can be a control chip or a drive chip. In order to perform better driving performance and improve space availability, the planar device 91 (controlling device/driving device) can also be disposed in parallel with the first planar power device 21, the second planar power device 22 and directly on the heat-dissipating substrate 23. Accordingly, the driving performance of the power module 900 can be better. For example the driving speed can be improved from the conventional speed of tens of nano-seconds (nS) to teens of nano-seconds even to single-digit nano-seconds.

In the practical application, if in the packaging process, more devices, like a driving device, a current sensor and a temperature sensor (e.g. negative temperature coefficient, NTC) are desired to be integrated in the power module, then these devices can be disposed on an insulating layer, which can be a print circuit board (PCB). Moreover, there is a conductive circuit layer covering the insulating layer to help the internal connections of the devices.

Figure 10A:
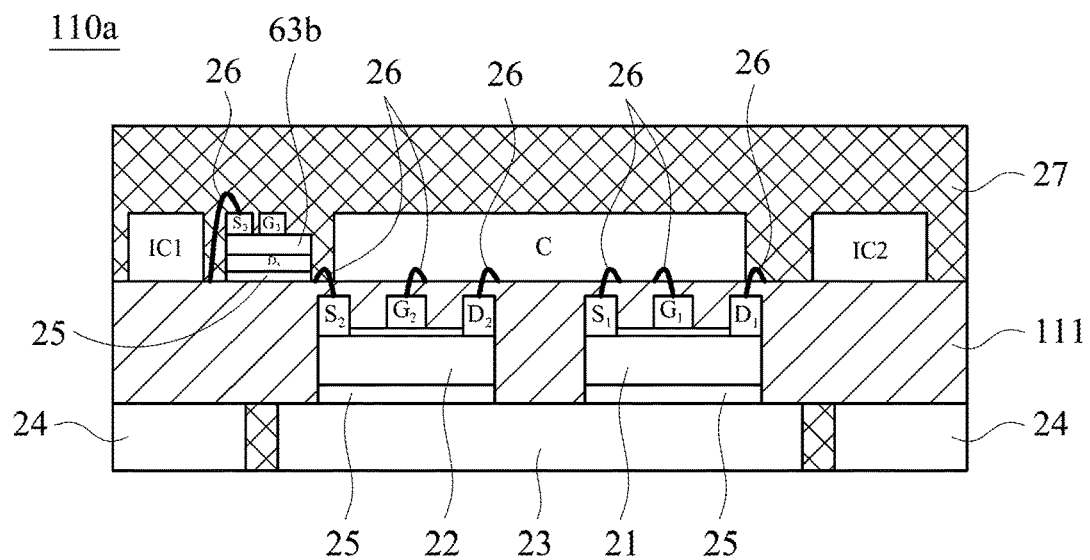
FIG. 10a is a schematic cross-sectional view showing a power module according to an embodiment of the present invention.
Figure 10B:
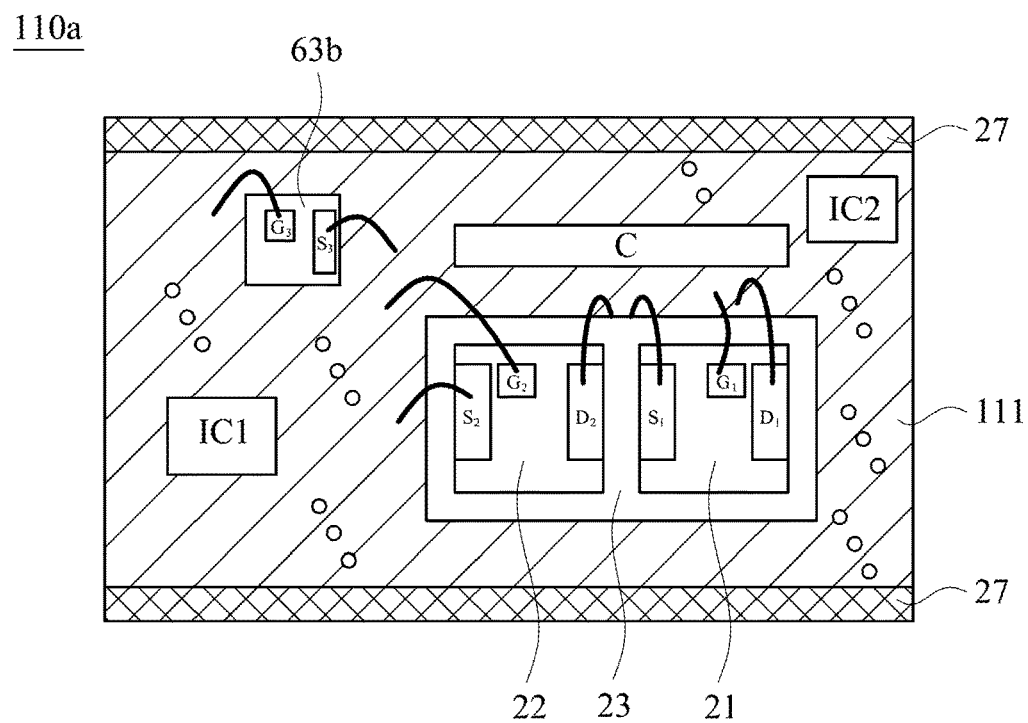

Referring to FIG. 10a and FIG. 10b, FIG. 10a is a schematic cross-sectional view showing a power module 110a according to an embodiment of the present invention, and FIG. 10b is a schematic top view showing a power module 110a according to FIG. 10a. The power module 110a includes the first planar power device 21, the second planar power device 22, the heat-dissipating substrate 23, a switching device 63b, a controlling device IC1, a driving device IC2, a capacitor C, a plurality of pins 24, and an insulating layer 111. The controlling device IC1 and the driving device IC2 are both planar devices. In this embodiment, the number of each of the first planar power device 21, the second planar power device 22, the switching device

63*b*, the driving device IC1 and the driving device IC2 is one, but this embodiment is not limited thereto.

In this embodiment, the power module 110*a* includes two planar devices which are the controlling device 101 and the driving device IC2. As shown in FIG. 10*a* and FIG. 10*b*, because the switching device 63*b*, the controlling device 101, the driving device IC2 and the capacitor C do not demand a lot of heat dissipation, they can be directly disposed on the insulating layer 111. The insulating layer 111 can be a PCB which at least contains two layers of boards. The insulating layer 111 is covered with a conductive circuit layer to help the internal connections of the devices. In addition, the insulating layer 111 can be directly soldered on the heat-dissipating substrate 23 for convenience, and several vias can be disposed on the insulating layer 111 for transmitting the heat on the heat-dissipating substrate 23 to the upper surface of the insulating layer 111, thereby achieving the effects of double-sides heat dissipation. It is noted that, because the devices disposed on the insulating layer 111 do not demand a lot of heat dissipation, cheap materials (e.g. circuit board) rather than expensive materials (e.g. directed bonded copper, DBC) can be used for forming the insulating layer 111 to reduce the cost of manufacturing the power module 110*a*.

Figure 10C:
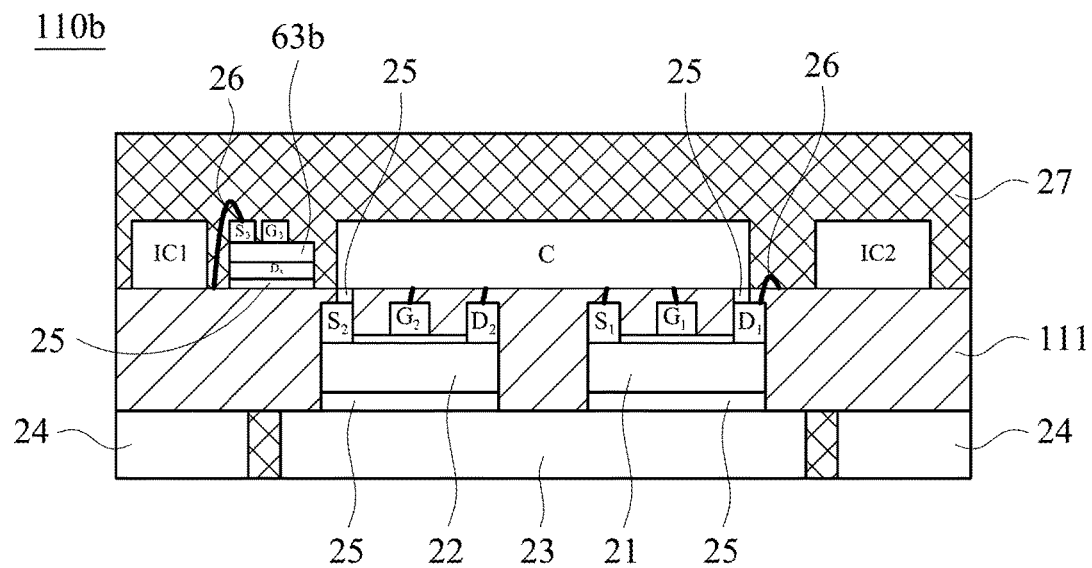
FIG. 10c is a schematic cross-sectional view showing a power module according to an embodiment of the present invention.
Figure 10D:
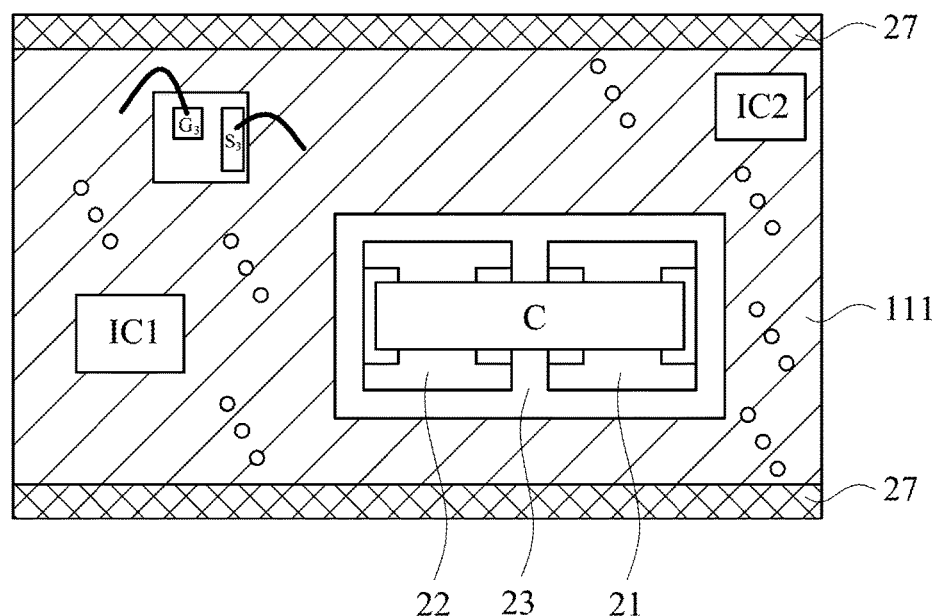
FIG. 10d is a schematic top view showing a power module according to FIG. 10c.

Further, for reducing the equivalent loop inductance of the power module, the arrangement of the capacitor still has great importance. Referring to FIG. 10*c* and FIG. 10*d*, FIG. 10*c* is a schematic cross-sectional view showing a power module 110*b* according to an embodiment of the present invention, and FIG. 10*d* is a schematic top view showing a power module 110*b* according to FIG. 10*c*. In this embodiment, the capacitor C of the power module 110*b* is disposed on the upper surface of the first planar power device 21 and the upper surface of the second planar power device 22, and is directly connected to the drain $D_1$ of the first planar power device 21 and the source $S_2$ of the second planar power device 22 by soldering so as to get a minimum equivalent loop inductance, but the arrangement of the capacitor C is not limited to this embodiment. Hence, the electrical property of the power module 110*b* is greatly improved without affecting other properties.

Figure 10E:
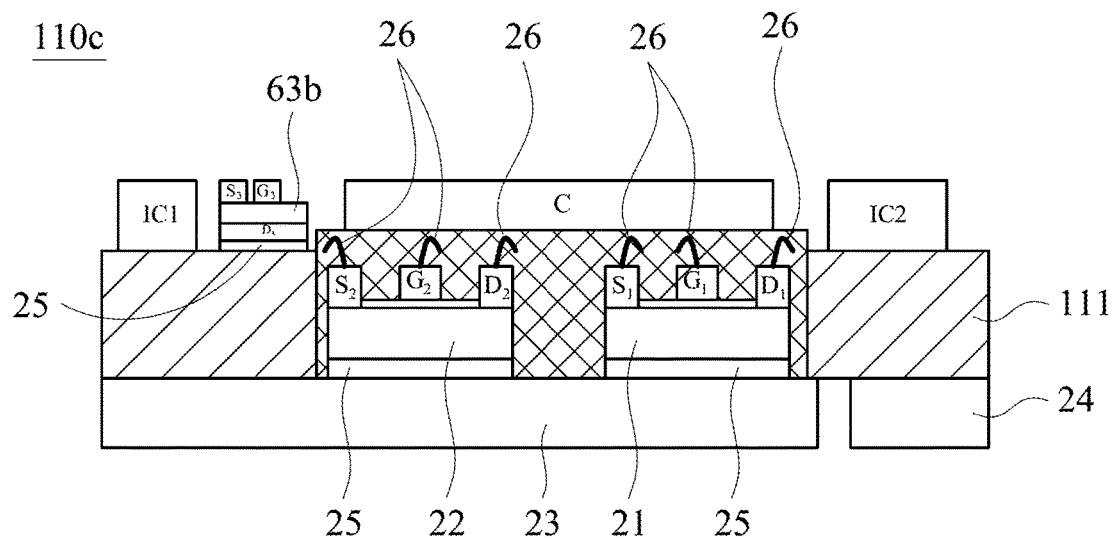
FIG. 10e is a schematic cross-sectional view showing a power module according to an embodiment of the present invention.
Figure 10F:
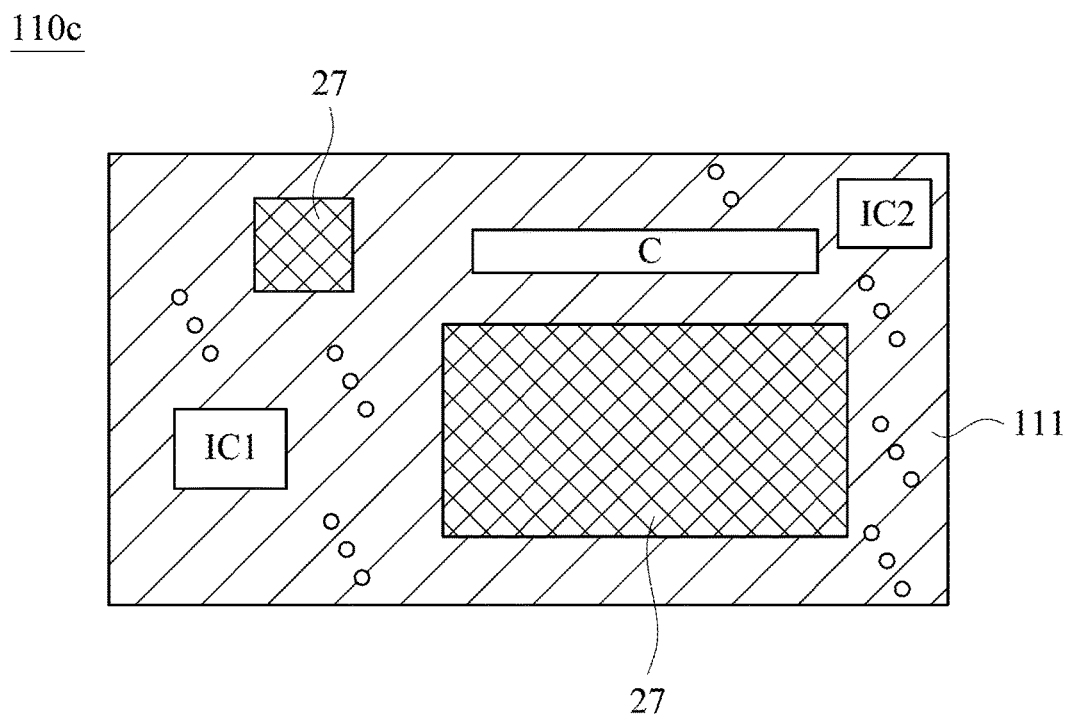
FIG. 10f is a schematic top view showing a power module according to FIG. 10e.

In the aforementioned embodiments, after completing the connections of the respective devices (e.g. by wire bonding), all areas of the devices are covered by a molding material 27 by molding, injecting, so as to protect the devices. For example, the molding material 27 is formed to cover the first planar power device 21 and the second planar power device 22; or the molding material 27 is formed to cover the controlling device 101, the driving device IC2, the capacitor C, and the switch device 63*b*; or the molding material 27 is formed to cover a portion of the controlling device IC1, the driving device IC2, the capacitor C, the switch device 63*b*, the insulating layer 111, the heat-dissipating substrate 23 and the pins 24. However, with the use of the insulating layer, the molding process of the power module does not need to cover all the area, but only need to cover a portion of the devices. Referring to FIG. 10*e* and FIG. 10*f*, FIG. 10*e* is a schematic cross-sectional view showing a power module 110*c* according to an embodiment of the present invention, and FIG. 10*f* is a schematic top view showing a power module 110*c* according to FIG. 10*e*. As shown in FIG. 10*e* and FIG. 10*f*, the molding material 27 merely covers a portion area of the power module 110*c*. For example, the molding material 27 merely covers the first planar power device 21 and the second planar power device 22, and the other uncovered portions can be protected by the insulating layer 111 to achieve the dustproof, moisture-proof, electrical insulation functions. Thus, the fabrication cost of the power module is further decreased, the space occupied by the power module is reduced and also the heat dissipating performance of the power module is improved.

Figure 10G:
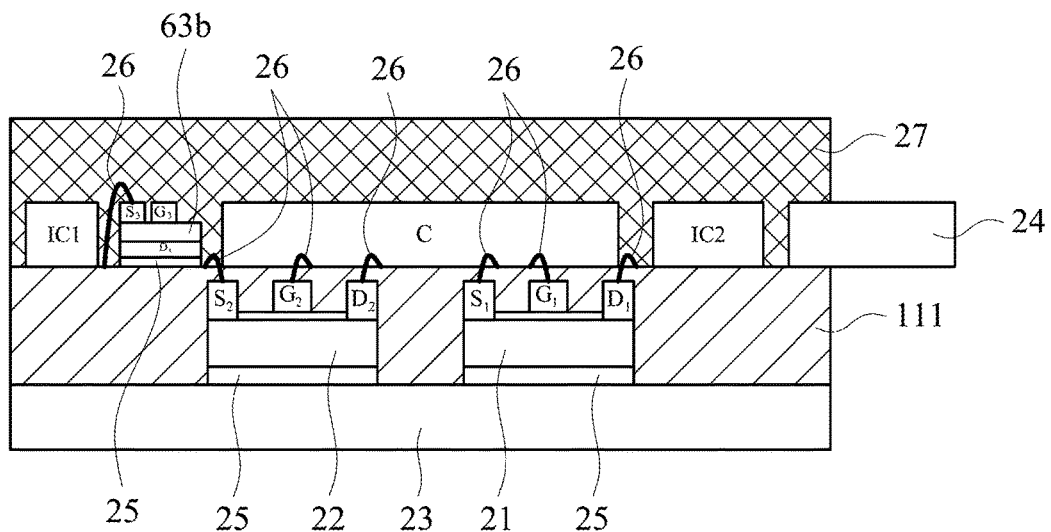
FIG. 10g is a schematic cross-sectional view showing a power module according to an embodiment of the present invention.

It is noted that, in the aforementioned embodiment, the pin 24 and the heat-dissipating substrate 23 are both disposed on the same plane, that is, the pin 24 and the heat-dissipating substrate 23 are located in the same side of the insulating layer 111. However, the pin 24 and the heat-dissipating substrate 23 may also be disposed on different surfaces, that is, the pin 24 and the heat-dissipating substrate 23 are located in different sides of the insulating layer 111 to increase the area of the heat-dissipating substrate 23, as shown in FIG. 10*g*. FIG. 10*g* is a schematic cross-sectional view showing a power module 110*d* according to an embodiment of the present invention. In this embodiment, the pin 24 is disposed on the insulating layer 111, and on the different plane from the heat-dissipating substrate 23. Each device of the power module 110*d* is connected to the pin 24 through the bonding wire 26 and the electro-conductive circuit layer of the insulating layer 111 (not shown in FIG. 10*g*). Thus, the area of the heat-dissipating substrate 23 can be enlarged to improve the heat dissipating performance of the power module 110*d*.

Figure 10H:
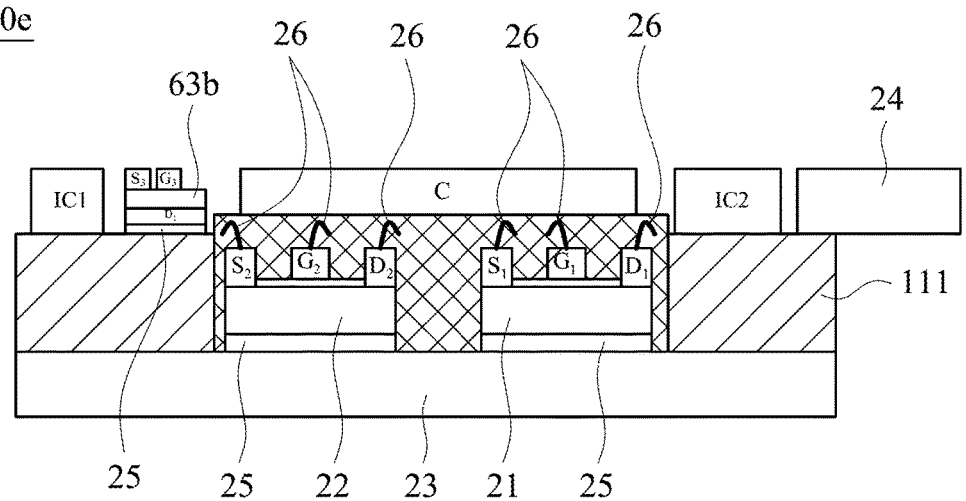
FIG. 10h is a schematic cross-sectional view showing a power module according to an embodiment of the present invention.

Similarly, the power module 110*d* may be partially molded. Referring to FIG. 10*h*, FIG. 10*h* is a schematic cross-sectional view showing a power module 110*e* according to an embodiment of the present invention. As shown in FIG. 10*h*, the pin 24 of the power module 110*e* is also disposed on the insulating layer 111, and the molding material 27 covers only a portion of the power module 110*e*. For example, the molding material 27 covers the first planar power device 21 and the second planar power device 22. Thus, the heat dissipating performance of the power module can be further improved (because the area of the heat-dissipating substrate 23 is also increased), and also the fabrication cost of the power module and the space occupied thereby can be reduced.

Figure 10I:
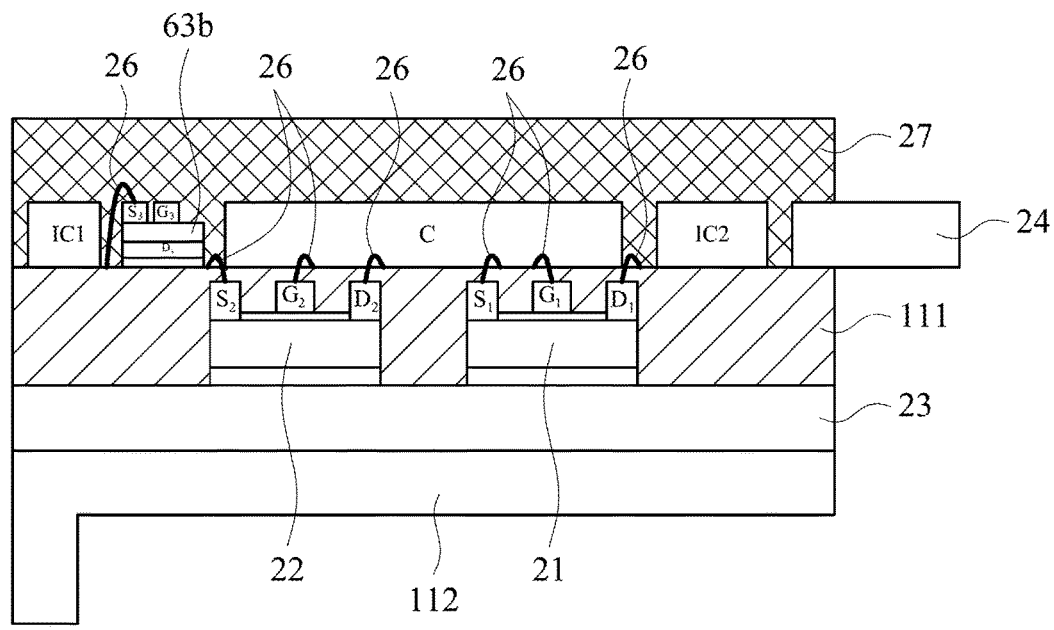
FIG. 10i is a schematic cross-sectional view showing a power module according to an embodiment of the present invention.

Except for the advantages described above, the arrangement of the pin 24 and the heat-dissipating substrate 23 disposed on the different planes may facilitate the disposition of another heat sink as shown in FIG. 10*i*. FIG. 10*i* is a schematic cross-sectional view showing a power module 110*f* according to an embodiment of the present invention. The power module further includes a heat sink 112 disposed on another side of the heat-dissipating substrate 23 to satisfy the requirement of the power module with larger power.

Figure 11:
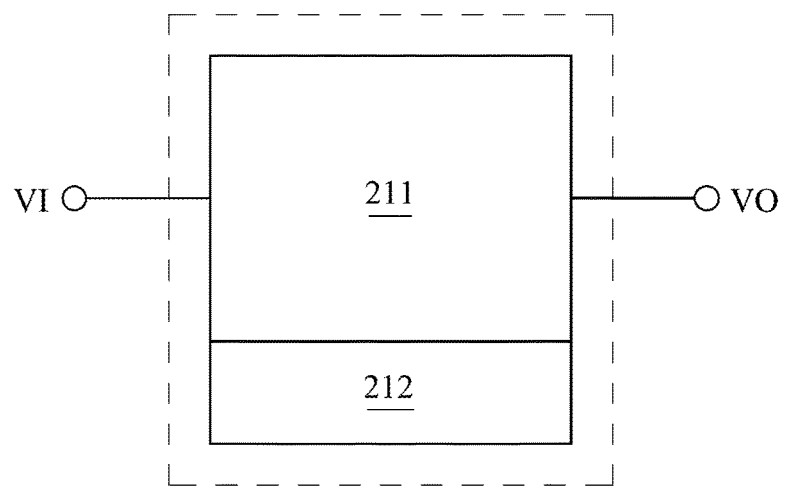
FIG. 11 is a schematic diagram showing a power converter according to an embodiment of the present invention.

Referring to FIG. 11, FIG. 11 is a schematic diagram showing a power converter 210 according to an embodiment of the present invention. As shown in FIG. 11, the power converter includes a power module 211, a power input terminal VI, a power output terminal VO, and a heat sink 212. The power module 211 can be any one of the power modules in the aforementioned embodiment, but is not limited thereto. The power input terminal VI and the power output terminal VO are connected to the power module 211. The heat sink 212 can be disposed adjacent to the heat-dissipating substrate (not shown in FIG. 11) in the power module 211 in order to provide better heat dissipating performance to the power converter 210.

Moreover, the power converter 210 receives an input voltage through the power input terminal VI, and the input voltage is converted into an output voltage through the power converter 211. Then, the aforementioned output voltage is outputted through the power output terminal VO to achieve electric power conversion. According to the classifications of the electric power conversion, the power converters may be classified into any one of a non-isolated AC/DC power converter, a non-isolated DC/DC power converter, an isolated DC/DC converter, and an isolated AC/DC power converter. Accordingly, the power module 211 can be changed in the power converter 210 of the embodiment of the present invention to achieve the function of the electric power conversion.

Figure 12A:
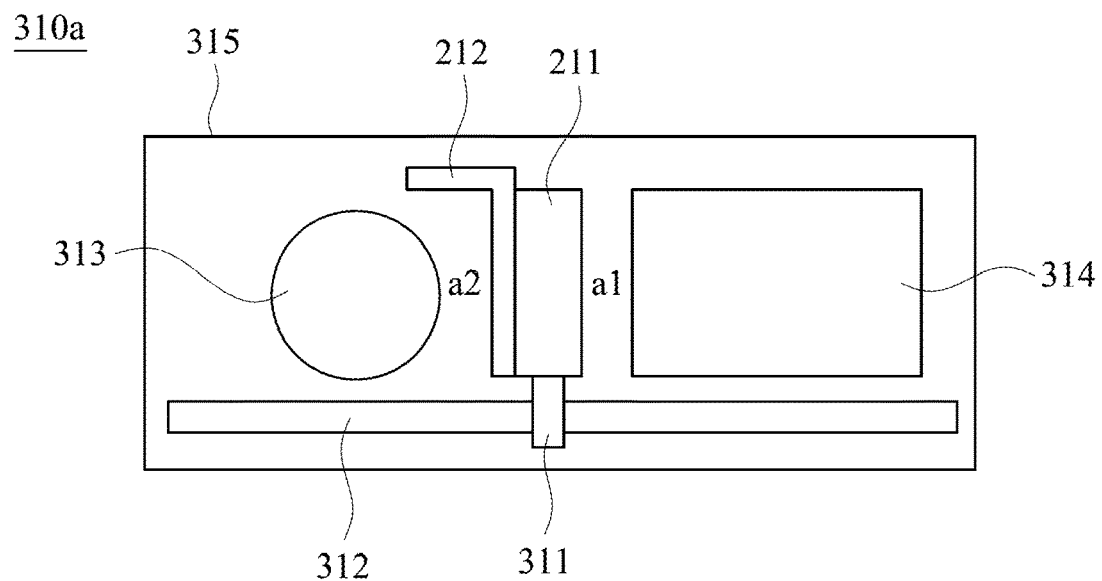
FIG. 12a is a schematic diagram showing a power converter according to an embodiment of the present invention.

Referring to FIG. 12a, FIG. 12a is a schematic diagram showing a power converter 310a according to an embodiment of the present invention. As shown in FIG. 12a, the power converter 310a includes the power module 211, the heat sink 212, a pin 311, a circuit board 312, a first integrated device 313, a second integrated device 314 and a shell 315. The heat sink 212 can be disposed or integrated adjacent to the heat-dissipating substrate (not shown in FIG. 12a) in the power module 211, and the power module 211 is connected to the circuit board 312 though the pin 311. Also, the power converter 310a includes the first integrated device 313 and the second integrated device 314 to provide other functions required by the power converter 310a. It is noted that, because several vias (not shown in FIG. 12a) are disposed on the insulating layer of the power module 211, the power module 211 can dissipate heat from its two sides (double-sides heat dissipation). Hence, when the power module 211 is disposed, the two sides of the power module 211 should have air channels, as shown in the area a1 and a2 in FIG. 12a, so as to enable the power module 211 to have the best heat dissipating performance.

Figure 12B:
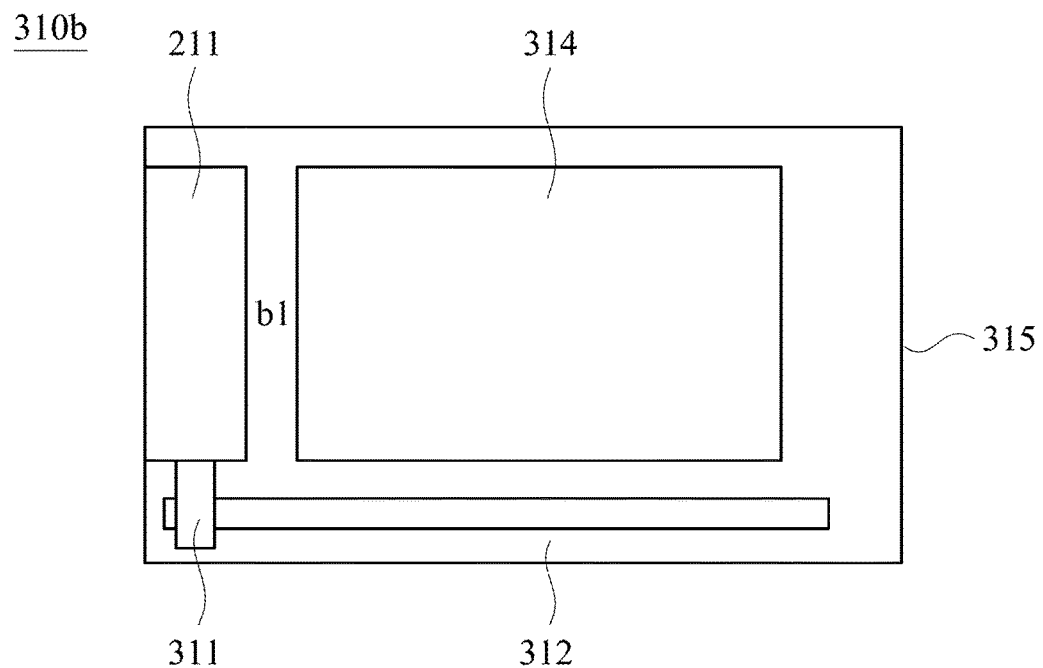
FIG. 12b is a schematic diagram showing a power converter according to an embodiment of the present invention.

Referring to FIG. 12b, FIG. 12b is a schematic diagram showing a power converter 310b according to an embodiment of the present invention. As shown in FIG. 12b, one side of the power module 211 of the power converter 310b is assembled onto the shell 315, and another side thereof provides an air channel (area b1) to implement the double sides heat dissipation for the power module 211.

Figure 13A:
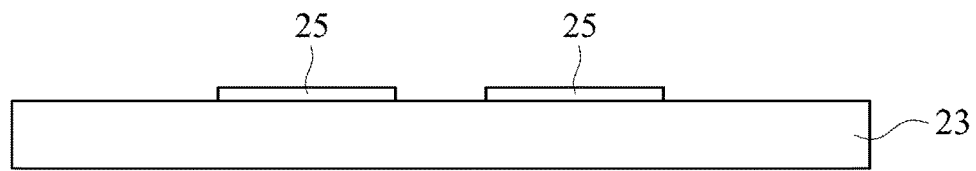
FIGS. 13a to 13f are schematic diagrams showing processes of manufacturing power modules according to an embodiment of the present invention.

Referring to FIGS. 13a to 13f, FIGS. 13a to 13f are schematic diagrams showing processes of manufacturing power modules according to an embodiment of the present invention. First, as shown in FIG. 13a, a heat-dissipating substrate 23 is provided which can be formed from a good electro-conductive and thermo-conductive material, such as copper, aluminum and graphite or the like. Then, the position of the power device to be disposed on the heat-dissipating substrate 23 is planed, and solder or an adhesive agent is attached to the heat-dissipating substrate 23 by coating, dispensing or the like. In this embodiment, the solder 25 is attached to the heat-dissipating substrate 23, but the attachment method is not limited thereto.

Figure 13B:
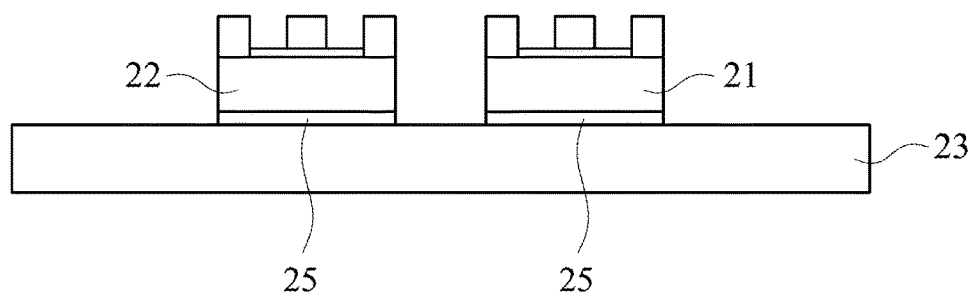

Next, as shown in FIG. 13b, at least one first planar power device 21 and a second planar power device 22 are provided, and the first planar power device 21 and the second planar power device 22 are disposed on a planned position on the heat-dissipating substrate 23 by soldering, adhering or the like. In this embodiment, the first planar power device 21 and the second planar power device 22 are disposed on the heat-dissipating substrate 23 by soldering, but the embodiment is not limited to soldering.

Figure 13C:
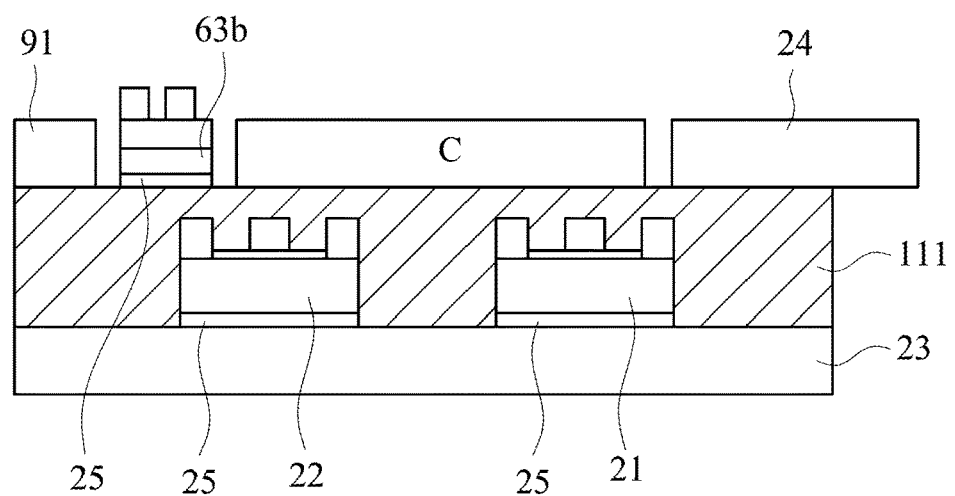

Then, as shown in FIG. 13c, a insulating layer 111 is provided, and the related devices include at least one planar device 91 (e.g. a controlling device IC1 or a driving device IC2), at least one switching device 63b, at least one capacitor C, and the pin 24 are disposed on the insulating layer 111. For convenience and clarity of explanation, the number of each of the planar device 91, the switching device 63b, the capacitor C and the pin 24 shown in the embodiment is one, but this embodiment is not limited thereto. Moreover, in this embodiment, the surface mount devices (SMD) reflow technique is applied to mount the planar device, the switching device 63b, the capacitor C and the pin 24 on the insulating layer 111, but this embodiment is not limited this mounting method. Moreover, the insulating layer 111 can be a circuit board, which is formed from electrically insulating materials, and the insulating layer 111 is covered with an electro-conductive circuit layer (not shown in FIG. 13c) to help the internal connections of devices mounted on the insulating layer 111. Then, the insulating layer 111 covers the heat-dissipating substrate 23, and covers the first planar power device 21 and the second planar power device 22.

Figure 13D:
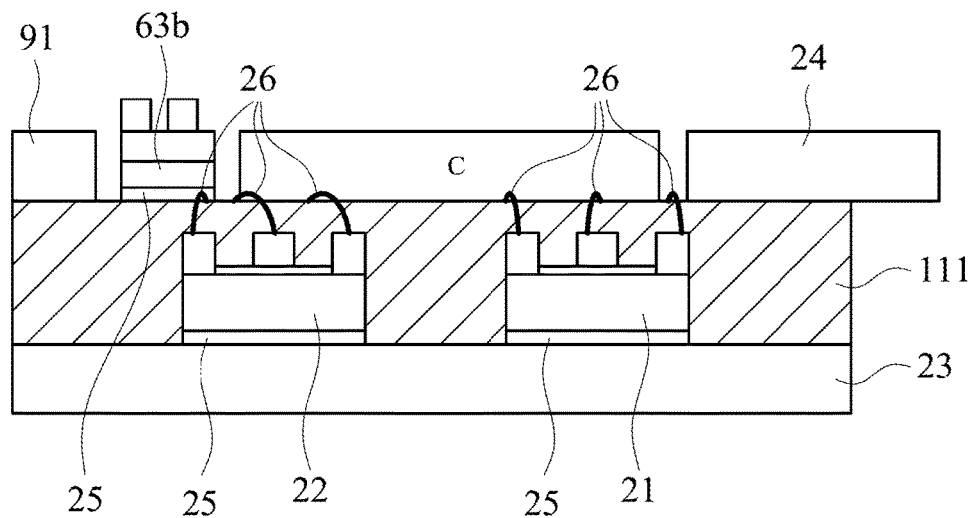

Then, as shown in FIG. 13d, the first planar power device 21, the second planar power device 22, the planar device 91, the switching device 63b, and the capacitor C are connected to the corresponding pins 24 by wire bonding, lithography, soldering or the like. In this embodiment, the connection method is wire bonding, and each device is connected to the corresponding position through wire bonding 26, but thus embodiment is not limited to this connection method.

Figure 13E:
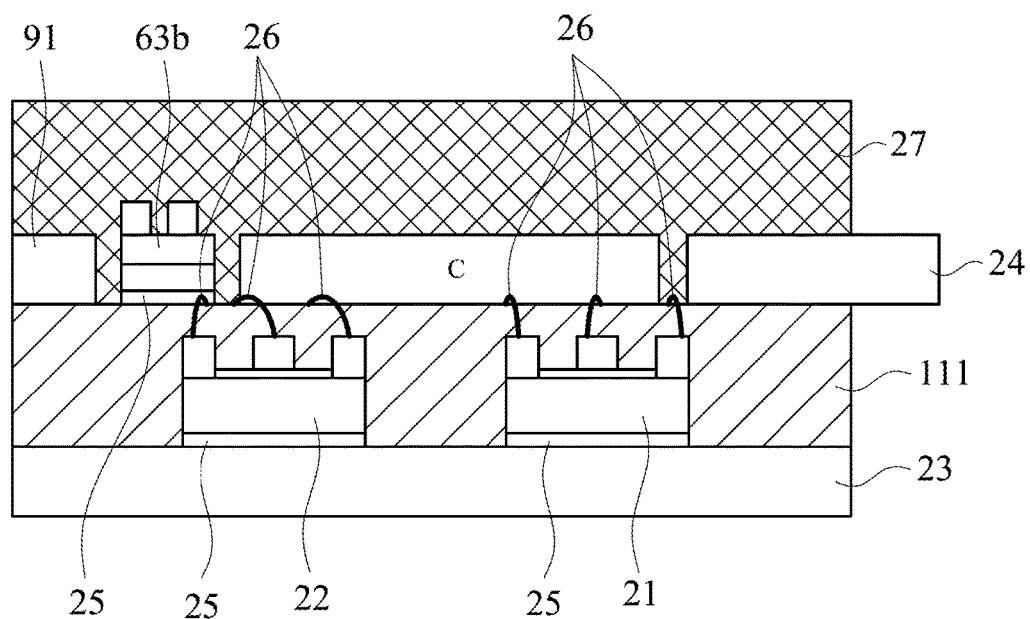
Figure 13F:
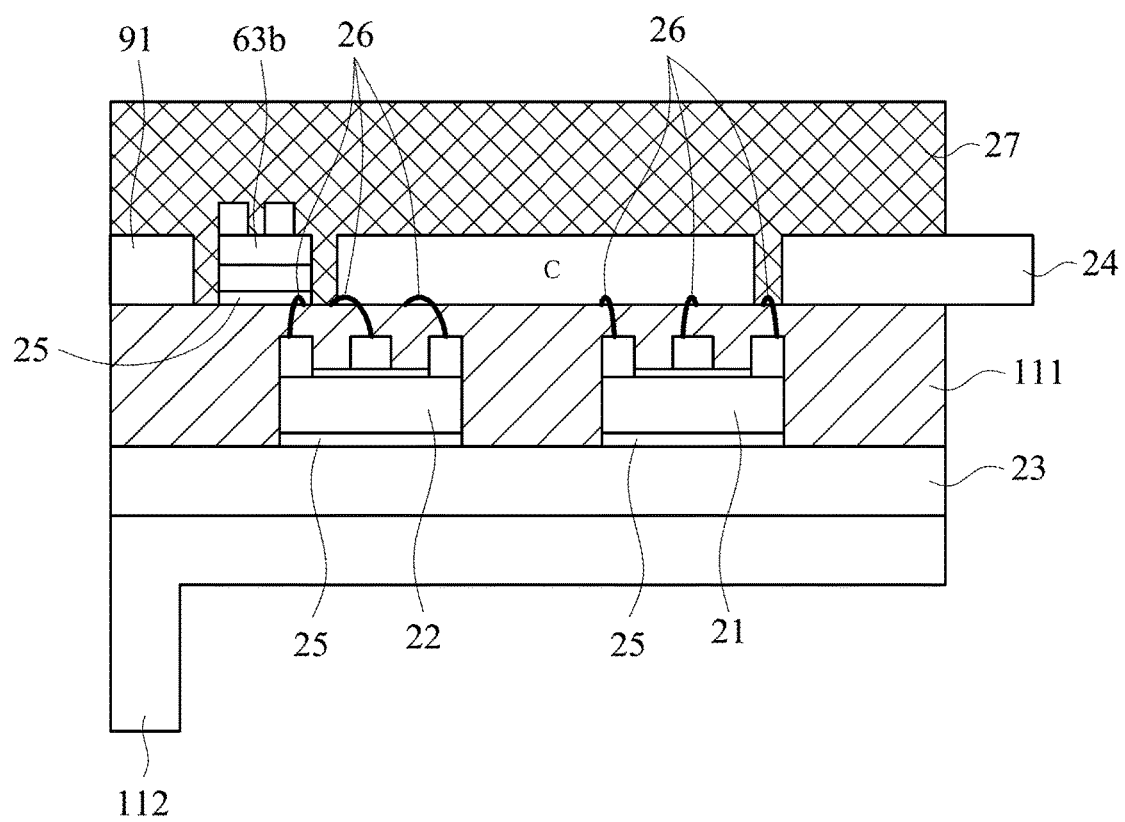

Thereafter, as shown in FIG. 13e, the insulating layer 111 is formed to cover the molding material 27 by dispensing, molding technique or the like, such that the modeling material can uniformly cover the planar device 91, the switching device 63b, the capacitor C and a portion of the pin 24, so that the mechanical, dustproof, moisture-proof, and insulation protection functions may be achieved. Then, as shown in FIG. 13f, another heat sink 212 can be disposed adjacently to another side of the heat-dissipating substrate 23, thereby increasing the heat dissipating performance of the power module.

In a process diagram of manufacturing a power module provided in one embodiment of the present invention, the arrangement positions of the planar device 91, the switching device 63b, the capacitor C and the pin 24 can be any positions disclosed in the aforementioned embodiments. This embodiment merely uses one of the aforementioned embodiments as an example, but this embodiment is not limited thereto.

In the aforementioned embodiments, the packaging method of the power module uses the implementation of the half-bridge circuit as an example, that is, at least two of planar GaN power devices are used to implement the structure of the half-bridge. However, the packaging method of the power device in the aforementioned embodiments can also be applied to the integrated circuit having more bridges or to a non-bridge circuit.

Figure 14:
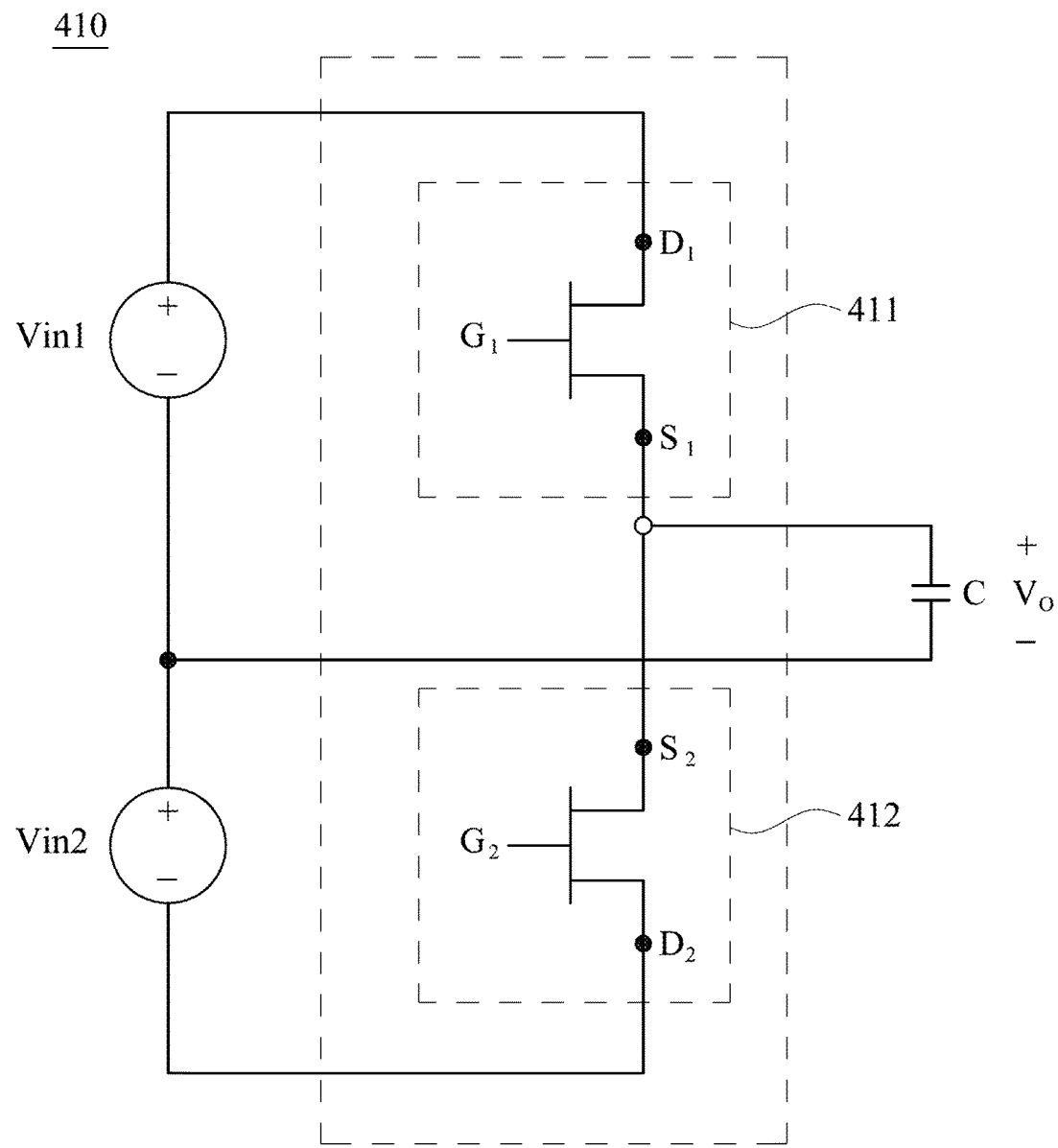
FIG. 14 shows a half-bridge circuit according to an embodiment of the present invention.

Referring to FIG. 14, FIG. 14 shows a half-bridge circuit 410 according to an embodiment of the present invention. As shown in FIG. 14, the source $S_1$ of a first planar GaN power device 411 is connected to a source $S_2$ of the second planar GaN power device 422. In addition, the drain $D_1$ of the first planar GaN power device 411 and the drain $D_2$ of the second planar GaN power device 422 are respectively connected to a first input voltage terminal Vin1 and a second input voltage terminal Vin2. In other words, the first planar GaN power device 411 and the second planar GaN power device 412 are respectively constructed by the upper and lower bridge arms of the half-bridge circuit 410 to implement the function of rectification.

As known in the aforementioned embodiment of the present invention, not only the space availability is effectively increased, but also the cost of disposing the DCB ceramic substrate is saved via the power module formed by directly disposing the planar power device on the heat-dissipating substrate. Moreover, the heat dissipating performance of the power module can be significantly enhanced, and the electric property of the power module is improved as well by the capacitor disposition. Thus, high efficiency or high power density of the power converter can also be achieved, and the energy conversion efficiency of the power converter can also be advantageously enhanced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A power module, comprising:
   a heat-dissipating substrate;
   a first planar power device comprising a plurality of electrodes which are all on an upper surface of the first planar power device;
   a second planar power device comprising a plurality of electrodes which are all on an upper surface of the second planar power device;
   a capacitor disposed above the first planar power device and the second planar power device, wherein the capacitor is directly electrically connected to electrodes of the first planar power device and the second planar power device;
   at least one switching device, wherein the at least one switching device is electrically connected to the electrodes of the first planar power device or the electrodes of the second planar power device; and
   an insulating layer having a top surface and a bottom surface, wherein the bottom surface of the insulating layer is disposed on the heat-dissipating substrate, the capacitor is disposed on the top surface of the insulating layer, and the switching device is disposed on the top surface of the insulating layer,
   wherein a lower surface of the first planar power device and a lower surface of the second planar power device are disposed above the heat-dissipating substrate.

2. The power module of claim 1, wherein the heat-dissipating substrate is made from an electro- and thermo-conductive material.

3. The power module of claim 2, wherein at least one of the first planar power device and the second planar power device is a gallium-nitride (GaN) power device.

4. The power module of claim 2, further comprising a plurality of pins, wherein the electrodes of the first planar power device and the electrodes of the second planar power device are connected to the corresponding pins, respectively.

5. The power module of claim 4, wherein the pins comprise an input voltage pin and at least one output voltage pin, and the electrodes of the first planar power device comprises a drain electrically connected with the input voltage pin and a source electrically connected with the at least one output voltage pin, and the electrodes of the second planar power device comprise a drain electrically connected with the at least one output voltage pin and a source electrically connected to the heat-dissipating substrate.

6. The power module of claim 5, wherein one end of the capacitor is directly connected to the drain of the first planar power device, and the other end of the capacitor is directly connected to the source of the second planar power device.

7. The power module of claim 1, wherein the first planar power device and the second planar power device are disposed on the same heat-dissipating substrate.

8. The power module of claim 1, wherein the switching device has an upper surface and a lower surface, and the switching device comprises a gate and a source located on the upper surface of the switching device, and a drain located on the lower surface of the switching device.

9. The power module of claim 8, wherein at least one of the first planar power device and the second planar power device is a normally-on device and the at least one switching device is a normally-off device.

10. The power module of claim 9, wherein the at least one switching device is a normally-off silicon (Si) device or a normally-off gallium-nitride (GaN) device.

11. The power module of claim 8, wherein the voltage withstand capacity of the first planar power device is substantially the same as the voltage withstand capacity of the second planar power device, and the voltage withstand capacity of the first planar power device is at least two times greater than the voltage withstand capacity of the at least one switching device.

12. The power module of claim 8, wherein the at least one switching device comprises a switching device having a first end and a second end, and the first end is electrically coupled with a source of the second planar power device, the power module further comprising:
   a first capacitor of which one end is electrically coupled with a drain of the first planar power device and the other end is electrically coupled with a source of the second planar power device.

13. The power module of claim 12, wherein the voltage withstand capacity of the first planar power device and the voltage withstand capacity of the second planar power device, are at least two times greater than the voltage withstand capacity of the switching device.

14. The power module of claim 12, wherein the first planar power device and the second planar power device are both normally-on devices.

15. The power module of claim 4, further comprising at least one planar device, at least one first capacitor, and an insulating layer, wherein the at least one planar device and the at least one first capacitor are disposed on the insulating layer, and the insulating layer is disposed on the heat-dissipating substrate.

16. The power module of claim 15, further comprising at least one switching device, wherein the at least one switching device is disposed on the insulating layer, and the heat-dissipating substrate and the pins are disposed on the same side of the insulating layer.

17. The power module of claim 16, comprising a molding material covering the first planar power device and the second planar power device.

18. The power module of claim 17, wherein the molding material further covers the at least one planar device, the at least one switching device and the at least one first capacitor.

19. A power converter, comprising:
   a power module of claim 1;
   a power input terminal connected to the power module; and
   a power output terminal connected to the power module;
   wherein the power input terminal receives an input voltage which is converted by the power module into an output voltage outputted through the power output terminal.

20. The power module of claim 1, wherein the heat-dissipating substrate is used as a pin.

21. The power module of claim 8, wherein the drain of the switching device is disposed on the top surface of the insulating layer by solder.

22. The power module of claim 1, wherein the first and second planar power devices are disposed at a location corresponding to between the top and bottom surfaces of the insulating layer.

23. The power module of claim 1, wherein the first and second planar power devices are embedded in the insulating layer.

\* \* \* \* \*